United States Patent
Bowman et al.

(10) Patent No.: US 11,398,812 B1
(45) Date of Patent: Jul. 26, 2022

(54) ADAPTIVE CLOCK DUTY-CYCLE CONTROLLER

(71) Applicant: QUALCOMM Incorporated, San Diego, CA (US)

(72) Inventors: Keith Alan Bowman, Morrisville, NC (US); Daniel Yingling, Apex, NC (US); Dipti Ranjan Pal, Irvine, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/485,355

(22) Filed: Sep. 25, 2021

(51) Int. Cl.
| | | |
|---|---|---|
| *G04F 10/00* | (2006.01) | |
| *H03K 3/017* | (2006.01) | |
| *H03K 3/037* | (2006.01) | |
| *G06F 1/10* | (2006.01) | |
| *H03K 5/14* | (2014.01) | |
| *H03K 5/00* | (2006.01) | |

(52) U.S. Cl.
CPC ............ *H03K 3/017* (2013.01); *G04F 10/005* (2013.01); *G06F 1/10* (2013.01); *H03K 3/037* (2013.01); *H03K 5/14* (2013.01); *H03K 2005/00013* (2013.01)

(58) Field of Classification Search
None
See application file for complete search history.

(56) References Cited

U.S. PATENT DOCUMENTS

| | | | |
|---|---|---|---|
| 6,184,753 B1 | 2/2001 | Ishimi et al. | |
| 8,072,234 B2 * | 12/2011 | Fox | G01R 31/3177 |
| | | | 326/14 |
| 8,212,585 B1 | 7/2012 | Price | |
| 8,487,680 B1 | 7/2013 | Chung et al. | |
| 9,405,275 B2 * | 8/2016 | Chien | H03K 5/133 |
| 10,630,272 B1 | 4/2020 | Ashtiani et al. | |
| 10,911,165 B1 | 2/2021 | Albel et al. | |
| 11,121,706 B1 | 9/2021 | Kim et al. | |
| 2018/0275229 A1 | 9/2018 | Alexeyev | |
| 2018/0323952 A1 | 11/2018 | Chang et al. | |
| 2021/0320668 A1 * | 10/2021 | Todorokihara | H03K 5/14 |
| 2022/0069809 A1 | 3/2022 | Ting et al. | |

OTHER PUBLICATIONS

Chen, H., et al., "A 7nm 5G Mobile SoC Featuring a 3.0GHz Tri-Gear Application Processor Subsystem", 2021 IEEE International Solid-State Circuits Conference, Session 4, Processors, 4.1, Feb. 16, 2021, pp. 53-55.

* cited by examiner

*Primary Examiner* — Cassandra F Cox
(74) *Attorney, Agent, or Firm* — Loza & Loza, LLP

(57) ABSTRACT

A method of measuring a clock signal includes launching an edge of a timing signal on a first edge of the clock signal, outputting an edge of a capture signal on a second edge of the clock signal, receiving the edge of the timing signal and the edge of the capture signal at a time-to-digital converter (TDC), and measuring a time delay using the TDC, wherein the time delay is between a time the edge of the timing signal is received at the TDC and a time the edge of the capture signal is received at the TDC.

18 Claims, 23 Drawing Sheets

# US 11,398,812 B1

ADAPTIVE CLOCK DUTY-CYCLE CONTROLLER

BACKGROUND

Field

Aspects of the present disclosure relate generally to clock distribution, and, more particularly, to duty-cycle distortion in a clock distribution network.

Background

A system may include a clock generator (e.g., a phase-locked loop) configured to generate a clock signal for timing operations of one or more circuits (e.g., flip-flops) in the system. The system may also include a clock distribution network (also referred to as a clock tree) for distributing the clock signal from the clock generator to the one or more circuits. A challenge facing clock distribution is that asymmetric aging in one or more signal paths of the clock distribution network can cause duty-cycle distortion in the clock signal, which can lead to timing issues (e.g., timing violations) in the one or more circuits.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a timing measurement circuit. The timing measurement circuit includes a launch circuit having an enable input, a clock input, and an output, wherein the launch circuit is configured to receive an enable signal at the enable input, receive a clock signal at the clock input of the launch circuit, and, in response to receiving the enable signal, launch an edge of a timing signal at the output of the launch circuit on a first edge of the clock signal. The timing measurement circuit also includes a capture circuit having a clock input and an output, wherein the capture circuit is configured to receive the clock signal at the clock input of the capture circuit, and output an edge of a capture signal at the output of the capture circuit on a second edge of the clock signal. The timing measurement circuit also includes a time-to-digital converter (TDC) having a signal input, a capture input, and an output, wherein the signal input of the TDC is coupled to the output of the launch circuit, and the capture input of the TDC is coupled to the output of the capture circuit.

A second aspects relates to a method of measuring a clock signal. The method includes launching an edge of a timing signal on a first edge of the clock signal, outputting an edge of a capture signal on a second edge of the clock signal, receiving the edge of the timing signal and the edge of the capture signal at a time-to-digital converter (TDC), and measuring a time delay using the TDC, wherein the time delay is between a time the edge of the timing signal is received at the TDC and a time the edge of the capture signal is received at the TDC.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
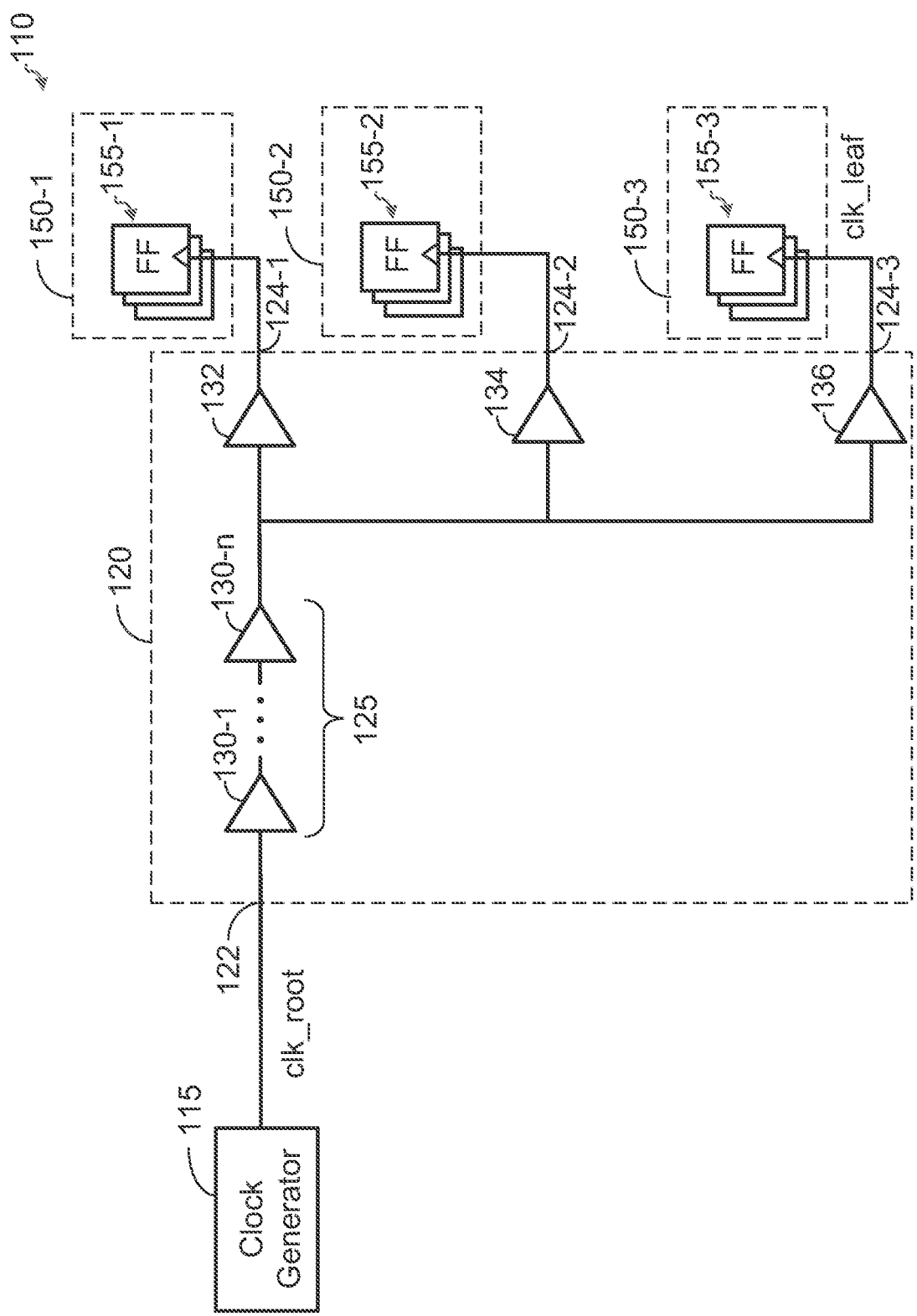
FIG. 1 shows an example of a system including a clock distribution network according to certain aspects of the present disclosure.

FIG. 1 shows an example of a system 110 including a clock generator 115, a clock distribution network 120, and multiple circuits 150-1 to 150-3 according to certain aspects. The clock generator 115 is configured to generate a clock signal for timing operations of the circuits 150-1 to 150-3. The clock generator 115 may be implemented with a phase-locked loop (PLL) or another type of clock generator 115. The clock distribution network 120 (also referred to as a clock tree) is configured to distribute the clock signal from the clock generator 115 to the circuits 150-1 to 150-3. As used herein, a "clock signal" may be a periodic signal that oscillates between high and low. A clock signal may be used, for example, to time operations of synchronous digital circuits or other types of circuits. A clock signal has a duty cycle, which may be expressed as a percentage or a fraction of a clock period (i.e., clock cycle) in which the clock signal is high (i.e., one). A clock signal may be gated to save power (e.g., when the circuits 150-1 to 150-3 are not active). Clock gating is a known technique for reducing dynamic power consumption when one or more circuits are not active.

In the example shown in FIG. 1, each of the circuits 150-1 to 150-3 may include respective flip-flops 155-1 to 155-3, which are clocked by the clock signal. It is to be appreciated that the circuits 150-1 to 150-3 are not limited to flip-flops and may include other devices in addition to or instead of the flip-flops 155-1 to 155-3.

In this example, the clock generator 115 is coupled to an input 122 of the clock distribution network 120, and each of the circuits 150-1 to 150-3 is coupled to a respective output 124-1 to 124-3 of the clock distribution network 120. The clock distribution network 120 receives the clock signal from the clock generator 115 via the input 122 (also referred to as a root node) and distributes the clock signal to the circuits 150-1 to 150-3 via the outputs 124-1 to 124-3 (also referred to as leaf nodes).

In the example shown in FIG. 1, the clock distribution network 120 includes a signal path 125, and delay buffers 132, 134, and 136. The signal path 125 includes delay buffers 130-1 to 130-*n* coupled in series. It is to be appreciated that the clock distribution network 120 may include additional delay buffers and/or other components not shown in FIG. 1. For example, the clock distribution network 120 may include adaptive clock distribution (not shown) to mitigate the impact of supply voltage droops. The clock distribution network 120 may also include one or more clock gating circuits (also referred to as clock gating cells) to gate the clock signal when the circuits 150-1 to 150-3 are idle to reduce dynamic power consumption when the circuits 150-1 to 150-3 are idle. As used herein, a "signal path" is a path through which a signal (e.g., a clock signal) propagates, and may include one or more delay buffers and/or one or more other components (e.g., a splitter, an amplifier, a switch, a voltage-level shifter, a clock-gating circuit, etc.).

A challenge with the clock distribution network 120 is that asymmetric aging in the clock distribution network 120 can cause duty-cycle distortion in the clock signal at the leaf nodes (i.e., the outputs 124-1 to 124-3), which are coupled to the circuits 150-1 to 150-3. The duty-cycle distortion can lead to timing issues (e.g., timing violations) in the circuits 150-1 to 150-3 if not corrected.

Figure 2A:
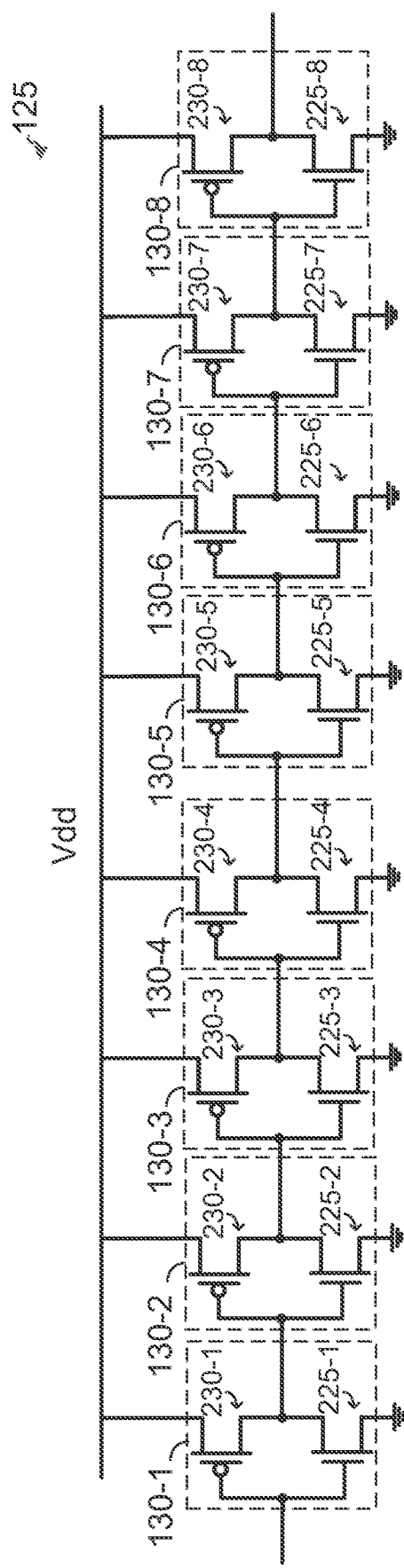
FIG. 2A shows an example of a signal path including delay buffers according to certain aspects of the present disclosure.

An example of duty-cycle distortion due to asymmetric aging in the signal path 125 of the clock distribution network 120 will now be discussed with reference to FIGS. 2A to 2C. FIG. 2A shows an example of the signal path 125 including the delay buffers 130-1 to 130-8 coupled in series. It is to be appreciated that the signal path 125 is not limited to the number of delay buffers 130-1 to 130-8 shown in FIG. 2A and that the signal path 125 may include a different number of delay buffers.

In the example shown in FIG. 2A, each of the delay buffers 130-1 to 130-8 is implemented with a respective complementary inverter including a first respective transistor 225-1 to 225-8 (e.g., n-type field effect transistor (NFET)) and a second respective transistor 230-1 to 230-8 (e.g., p-type field effect transistor (PFET)). However, it is to be appreciated that each of the delay buffers 130-1 to 130-8 may be implemented with another type of circuit or logic gate. It is also to be appreciated that a delay buffer may include two inverters coupled in series to implement a non-inverting delay buffer. In this case, the delay buffers 130-1 and 130-2 in FIG. 2A may be considered a first non-inverting delay buffer, the delay buffers 130-3 and 130-4 in FIG. 2A may be considered a second non-inverting delay buffer, and so forth.

In certain aspects, a clock gating circuit (not shown) may be coupled between the clock generator 115 and the input of the signal path 125. In this example, the clock gating circuit may be configured to pass the clock signal in an active mode and to gate the clock signal (i.e., block the clock signal) in an idle mode to conserve power in the idle mode.

Figure 2B:
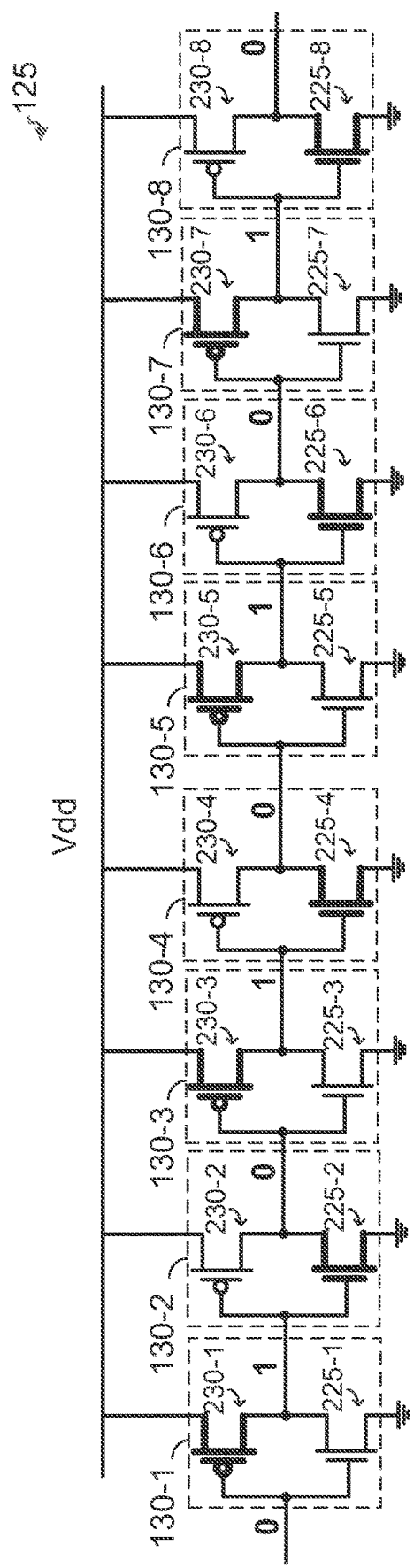
FIG. 2B shows an example in which an input of the signal path is held low in an idle mode according to certain aspects of the present disclosure.

FIG. 2B shows an example in which the clock signal is gated in the idle mode and the input of the signal path 125 is held low (i.e., logic zero) in the idle mode. FIG. 2B also shows the logic state at the output of each of the delay buffers 130-1 to 130-8 in the idle mode. As shown in FIG. 2B, the logic states at the outputs of the delay buffers 130-1 to 130-8 alternate between one and zero since the delay buffers 130-1 to 130-8 are implemented with inverters in this example.

In this example, the transistors 230-1, 225-2, 230-3, 225-4, 230-5, 225-6, 230-7, and 225-8 are turned on in the idle mode while the transistors 225-1, 230-2, 225-3, 230-4, 225-5, 230-6, 225-7, and 230-8 are turned off in the idle mode. In FIG. 2B, the transistors that are turned on are shown with thickened lines. The transistors 230-1, 225-2, 230-3, 225-4, 230-5, 225-6, 230-7, and 225-8 that are turned on in the idle mode are stressed in the idle mode, in which a DC voltage approximately equal to the supply voltage Vdd is applied across the gate to source of each of the transistors

230-1, 225-2, 230-3, 225-4, 230-5, 225-6, 230-7, and 225-8. The voltage stress in the idle mode causes the transistors 230-1, 225-2, 230-3, 225-4, 230-5, 225-6, 230-7, and 225-8 to age more than the transistors 225-1, 230-2, 225-3, 230-4, 225-5, 230-6, 225-7, and 230-8 that are turned off in the idle mode, which results in asymmetric aging of the transistors in the signal path 125.

In this example, the asymmetric aging increases the threshold voltages of the transistors 230-1, 225-2, 230-3, 225-4, 230-5, 225-6, 230-7, and 225-8, which slows down the transistors 230-1, 225-2, 230-3, 225-4, 230-5, 225-6, 230-7, and 225-8 relative to the transistors 225-1, 230-2, 225-3, 230-4, 225-5, 230-6, 225-7, and 230-8. The slowing down of the transistors 230-1, 225-2, 230-3, 225-4, 230-5, 225-6, 230-7, and 225-8 causes the falling edge delay at the output of the signal path 125 to increase relative to the rising edge delay at the output of the signal path 125. This is because a falling edge (i.e., falling transition) of the clock signal propagates to the output of the signal path 125 by sequentially turning on the transistors 230-1, 225-2, 230-3, 225-4, 230-5, 225-6, 230-7, and 225-8 that are stressed in the idle mode while a rising edge (i.e., rising transition) of the clock signal propagates to the output of the signal path 125 by sequentially turning on the transistors 225-1, 230-2, 225-3, 230-4, 225-5, 230-6, 225-7, and 230-8 that are not stressed in the idle mode. The increase in the falling edge delay relative to the rising edge delay causes a duty-cycle distortion in the signal path 125.

Figure 2C:
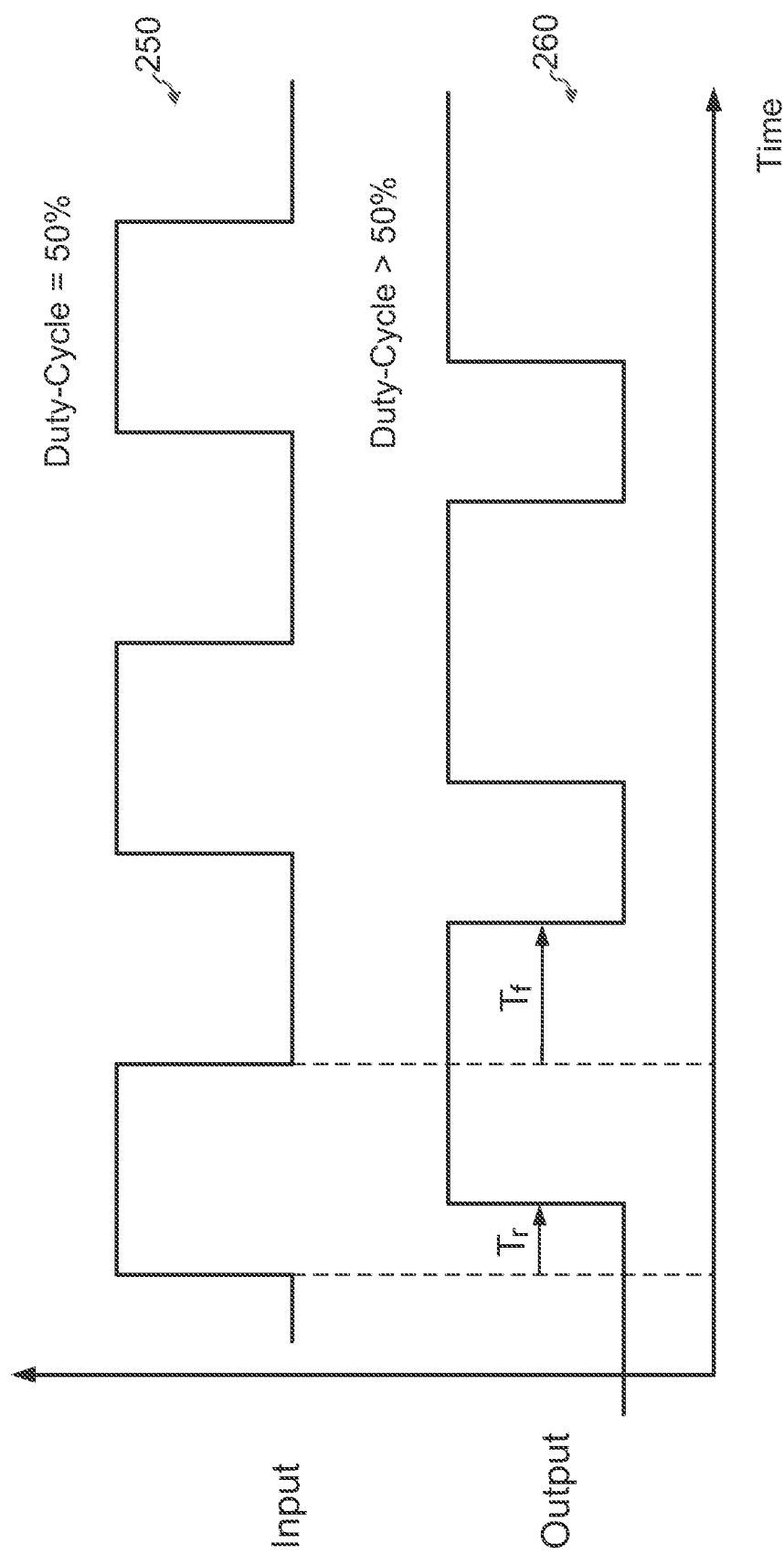
FIG. 2C illustrates an example of duty-cycle distortion in the signal path due to asymmetric aging according to certain aspects of the present disclosure.

An example of the duty-cycle distortion is illustrated in the timing diagram shown in FIG. 2C. In the example shown in FIG. 2C, a clock signal 250 is the input to the signal path 125 when the signal path 125 is not in the idle mode (i.e., the signal path 125 is active). In this example, the clock signal 250 at the input of the signal path 125 has a 50% duty cycle. FIG. 2C also shows the clock signal 260 at the output of the signal path 125 after the clock signal has propagated through the signal path 125. The signal path 125 delays a rising edge of the clock signal 260 by delay $T_r$ and delays a falling edge of the clock signal 260 by delay $T_f$. As shown in FIG. 2C, the delay $T_f$ of the falling edge is longer than the delay $T_r$ of the rising edge due to the asymmetric aging of the transistors in the signal path 125 discussed above. The longer delay of the falling edge causes the duty cycle of the clock signal 260 at the output of the signal path 125 to increase (i.e., results in a duty cycle greater than 50%). Thus, in this example, the duty-cycle distortion due to asymmetric aging increases the duty cycle of the clock signal.

Asymmetric aging also occurs for the case where the input of the signal path 125 is held high in the idle mode. In this case, the asymmetric aging causes the rising edge delay of the signal path 125 to increase relative to the falling edge delay of the signal path 125, resulting in duty-cycle distortion that decreases the duty cycle of the clock signal. Thus, asymmetric aging of the transistors in the signal path 125 causes duty-cycle distortion over time. The duty-cycle distortion can either increase or decrease the duty cycle of the clock signal depending on, for example, whether the input of the signal path 125 is held low or high in the idle mode, the number of delay buffers in the signal path 125, and/or other factors.

Figure 3:
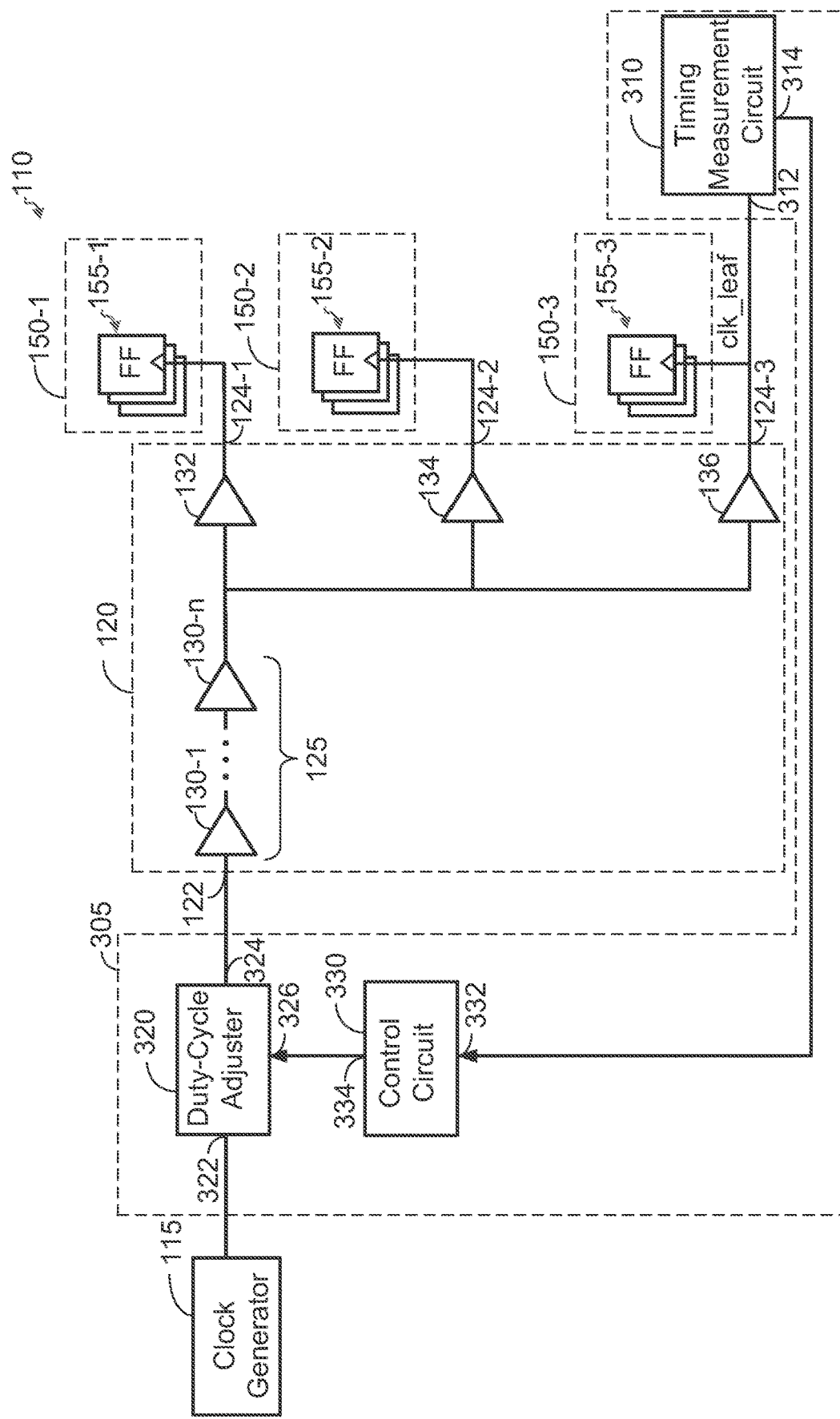
FIG. 3 shows an example of an adaptive clock duty-cycle controller according to certain aspects of the present disclosure.

FIG. 3 shows an example of an adaptive duty-cycle controller 305 configured to compensate for duty-cycle distortion according to certain aspects. The adaptive duty-cycle controller 305 includes a timing measurement circuit 310, a duty-cycle adjuster 320, and a duty-cycle control circuit 330.

The timing measurement circuit 310 has an input 312 and an output 314. In the example in FIG. 3, the input 312 of the timing measurement circuit 310 is coupled to a leaf node (i.e., output 124-3) of the clock distribution network 120. However, it is to be appreciated that the input 312 of the timing measurement circuit 310 may be coupled to another node in other examples, as discussed further below. The timing measurement circuit 310 is configured to receive the clock signal at the input 312, measure one or more timing parameters of the clock signal, and output a measurement signal based on the one or more measured timing parameters. The one or more timing parameters provide information related to the duty cycle of the clock signal received at the input 312 of the timing measurement circuit 310. For example, the one or more timing parameters may include a measurement of a high phase of the clock signal, in which the high phase is a duration that the clock signal is high (i.e., one) during one clock period (i.e., one period of the clock signal). In this example, for a given clock period, a larger high phase is indicative of a larger duty cycle and a smaller high phase is indicative of a smaller duty cycle. The one or more timing parameters may also include a measurement of a low phase of the clock signal, in which the low phase is a duration that the clock signal is low (i.e., zero) during one clock period. In this example, for a given clock period, a larger low phase is indicative of a smaller duty cycle and a smaller low phase is indicative of a larger duty cycle.

In the example in FIG. 3, the timing measurement circuit 310 is coupled to the leaf node (i.e., output 124-3). Thus, in this example, the timing measurement circuit 310 receives the clock signal after the clock signal has undergone duty-cycle distortion in the clock distribution network 120. As a result, the measurement signal from the timing measurement circuit 310 provides information on the duty-cycle distortion of the clock signal at the leaf node due to the aging effect in the clock distribution network 120. The timing measurement circuit 310 may also be referred to as a duty-cycle monitor, a duty-cycle measurement circuit, a duty-cycle detector, or another term.

The duty-cycle adjuster 320 has a signal input 322, a control input 326, and an output 324. The signal input 322 is coupled to the clock generator 115 and the output 324 is coupled to the clock distribution network 120. In the example in FIG. 3, the output 324 of the duty-cycle adjuster 320 is coupled to the root node (i.e., input 122) of the clock distribution network 120. The duty-cycle adjuster 320 is configured to receive the clock signal at the signal input 322, adjust the duty cycle of the clock signal (i.e., perform a duty-cycle adjustment of the clock signal), and output the clock signal after the duty-cycle adjustment at the output 324. The clock signal at the output 324 may also be referred to as the duty-cycle adjusted clock signal since the duty-cycle adjuster 320 adjusts the duty cycle of the clock signal received at the input 322 to generate the duty-cycle adjusted clock signal at the output 324. The duty-cycle adjuster 320 is configured to adjust the duty cycle of the clock signal based on a control signal received at the control input 326, as discussed further below. Since the output 324 of the duty-cycle adjuster 320 is coupled to the root node (i.e., input 122) of the clock distribution network 120 in this example, the duty-cycle adjuster 320 provides duty-cycle adjustment of the clock signal at the root node. However, it is to be appreciated that the present disclosure is not limited to this example.

The duty-cycle control circuit 330 has an input 332 and an output 334. The input 332 is coupled to the output 314 of the timing measurement circuit 310 and the output 334 is coupled to the control input 326 of the duty-cycle adjuster 320. The duty-cycle control circuit 330 is configured to receive the measurement signal from the timing measurement circuit 310, and set the duty-cycle adjustment of the clock signal by the duty-cycle adjuster 320 via the control input 326 based on the measurement signal.

In one example, the duty-cycle control circuit 330 compensates for the duty-cycle distortion in the clock distribution network 120 by determining a duty-cycle adjustment based on the measurement signal from the timing measurement circuit 310 and setting the duty-cycle adjustment of the duty-cycle adjuster 320 based on the determined duty-cycle adjustment. For example, the measurement signal from the timing measurement circuit 310 may indicate the high phase of the clock signal measured at the leaf node. In this example, the duty-cycle control circuit 330 may compare the measured high phase with a target high phase corresponding to a target duty cycle to determine a duty-cycle adjustment for the duty-cycle adjuster 320. For an example in which the target duty cycle is a 50% duty cycle, the target high phase is approximately equal to half a clock period. If the measured high phase is greater than the target high phase (which occurs when the duty cycle of the clock signal at the leaf node is greater than the target duty cycle), then the duty-cycle control circuit 330 may determine a duty-cycle adjustment for the duty-cycle adjuster 320 that decreases the duty cycle of the clock signal at the leaf node. In this case, the decrease in the duty cycle reduces the difference between the duty cycle of the clock signal at the leaf node and the target duty cycle. If, on the other hand, the measured high phase is less than the target high phase (which occurs when the duty cycle of the clock signal at the leaf node is less than the target duty cycle), then the duty-cycle control circuit 330 may determine a duty-cycle adjustment for the duty-cycle adjuster 320 that increases the duty cycle of the clock signal at the leaf node. Other examples for determining the duty-cycle adjustment for the duty-cycle adjuster 320 are discussed further below.

Thus, in this example, the adaptive duty-cycle controller 305 monitors the duty cycle of the clock signal at the leaf node using the timing measurement circuit 310, and adjusts the duty cycle of the clock signal at the root node based on the measurement signal from the timing measurement circuit 310 to compensate for the duty-cycle distortion in the clock distribution network 120. In certain aspects, the adaptive duty-cycle controller 305 may perform the duty-cycle adjustment each time the system 110 is booted.

In the example in FIG. 3, the adaptive duty-cycle controller 305 monitors the duty cycle of the clock signal at one leaf node (i.e., output 124-3) using the timing measurement circuit 310. In this example, there may be a high correlation between the duty cycle distortion at the leaf node coupled to the timing measurement circuit 310 and the duty cycle distortion at each of the other leaf nodes (i.e., outputs 124-1 and 124-2). However, it is to be appreciated that the adaptive duty-cycle controller 305 is not limited to this example. In another example, the adaptive duty-cycle controller 305 may include multiple timing measurement circuits, in which each of the timing measurement circuits is coupled to a respective leaf node for monitoring the duty cycle of the clock signal at the respective leaf node.

It is to be appreciated that the timing measurement circuit 310 is not limited to being coupled to a leaf node. For example, in some applications, the timing measurement circuit 310 may be coupled to a node located before the clock distribution network 120 or a node located within the clock distribution network 120. This may be done, for example, to provide duty-cycle compensation for another effect that causes duty-cycle distortion of the clock signal besides the aging effect in the clock distribution network 120 discussed above. In one example, the clock generator 115 may introduce duty-cycle distortion into the clock signal. To provide compensation for the duty-cycle distortion in the clock generator 115 in this example, the timing measurement circuit 310 may be coupled to the output 324 of the duty-cycle adjuster 320 before the clock distribution network 120. In another example, the timing measurement circuit 310 may be coupled to a node within the clock distribution network 120 to provide duty-cycle compensation within the clock distribution network 120. Thus, it is to be appreciated that the timing measurement circuit 310 may be coupled to any one of a number of nodes in a system (e.g., system 110) to provide duty-cycle compensation for various effects in the system that cause duty-cycle distortion.

A challenge with implementing the timing measurement circuit 310 is achieving a high-resolution timing measurement. High resolution allows more precise compensation of duty-cycle distortion (e.g., in the clock distribution network 120 and/or the clock generator 115). Achieving a high-resolution timing measurement becomes even more challenging as the frequency of the clock signal increases to achieve faster processing speeds, as discussed further below.

Figure 4:
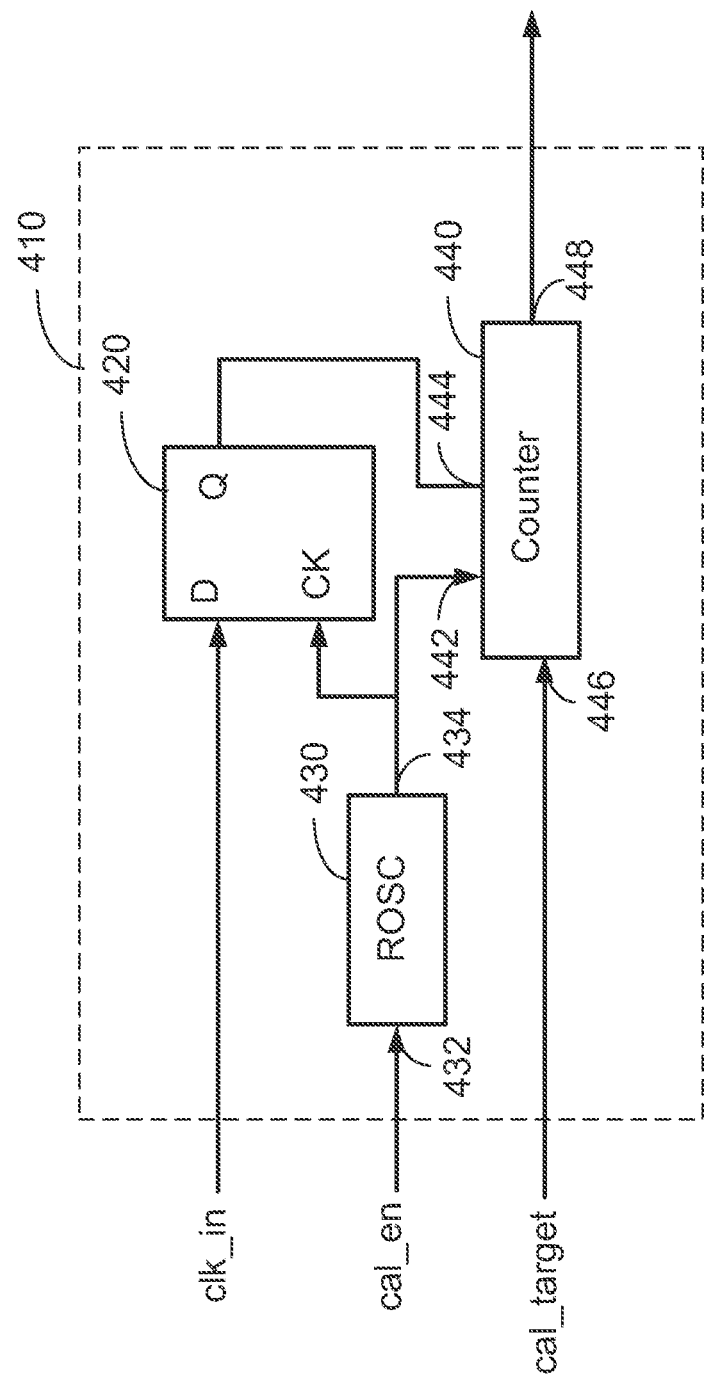
FIG. 4 shows an example of a timing measurement circuit including a ring oscillator according to certain aspects of the present disclosure.

FIG. 4 shows an example of a current implementation of a timing measurement circuit 410. The timing measurement circuit 410 includes a flip-flop 420, a ring oscillator 430, and a counter 440. The flip-flop 420 has a signal input (labeled "D") configured to receive the clock signal, a clock input (labeled "CK"), and an output (labeled "Q"). The ring oscillator 430 has an enable input 432 and an output 434. The counter 440 has a target input 446, a count input 442, an enable input 444, and an output 448.

In this example, the timing measurement circuit 410 measures a high phase of the clock signal (i.e., the duration that the clock signal is high during one clock period). To do this, the ring oscillator 430 is enabled by inputting an enable signal to the enable input 432 of the ring oscillator 430. This causes the ring oscillator 430 to generate a ring oscillator (RO) signal that oscillates at a frequency of the ring oscillator 430. The ring oscillator 430 outputs the RO signal at the output 434 of the ring oscillator 430, which is coupled to the clock input of the flip-flop 420 and the count input 442 of the counter 440.

In this example, the flip-flop 420 is clocked by the RO signal. The flip-flop 420 is configured to latch the logic state of the clock signal on rising edges of the RO signal, and output the latched logic state of the clock signal to the enable input 444 of the counter 440. In this example, the flip-flop 420 latches a one when the clock signal is high, and therefore outputs a one to the enable input 444 of the counter 440 for a duration approximately equal to a high phase of the clock signal.

In this example, the counter 440 counts a number of oscillations of the RO signal at the count input 442 while the flip-flop 420 outputs a one to the enable input 444 of the counter 440. Since the flip-flop 420 outputs a one to the enable input 444 of the counter 440 for a duration approximately equal to the high phase of the clock signal, the counter 440 counts the number of oscillations of the RO signal in the high phase of the clock signal. As a result, the count value of the counter 440 provides a measurement of the high phase of the clock signal (i.e., the duration that the clock signal is high during one clock period).

The counter 440 receives a target count value at the target input 446, in which the target count value indicates a count value for a target high phase corresponding to a target duty cycle (e.g., 50% duty cycle). The counter 440 then compares the count value from the RO signal with the target count value to determine whether the duty cycle of the clock signal is above or below the target duty cycle, and outputs a signal at the output 448 based on the comparison indicating whether to increase or decrease the duty cycle of the clock signal to compensate for duty-cycle distortion.

A challenge with the RO-based timing measurement circuit 410 shown in FIG. 4 is that, in order to achieve a high resolution, the frequency of the ring oscillator 430 needs to be much higher than the frequency of the clock signal. As the frequency of the clock signal increases, high resolution becomes increasingly difficult to achieve with the RO-based timing measurement circuit 410. For example, for a clock frequency of 2 GHz with a corresponding clock period of 500 ps, a ring oscillator frequency of 10 GHz with a corresponding clock period of 100 ps only provides a resolution of 20% of one clock period, which is quite low.

To address the above, aspects of the present disclosure provide timing measurement circuits capable of measuring one or more timing parameters of the clock signal with high resolution using an adjustable delay circuit and/or a time-to-digital converter (TDC), as discussed further below.

Figure 5:
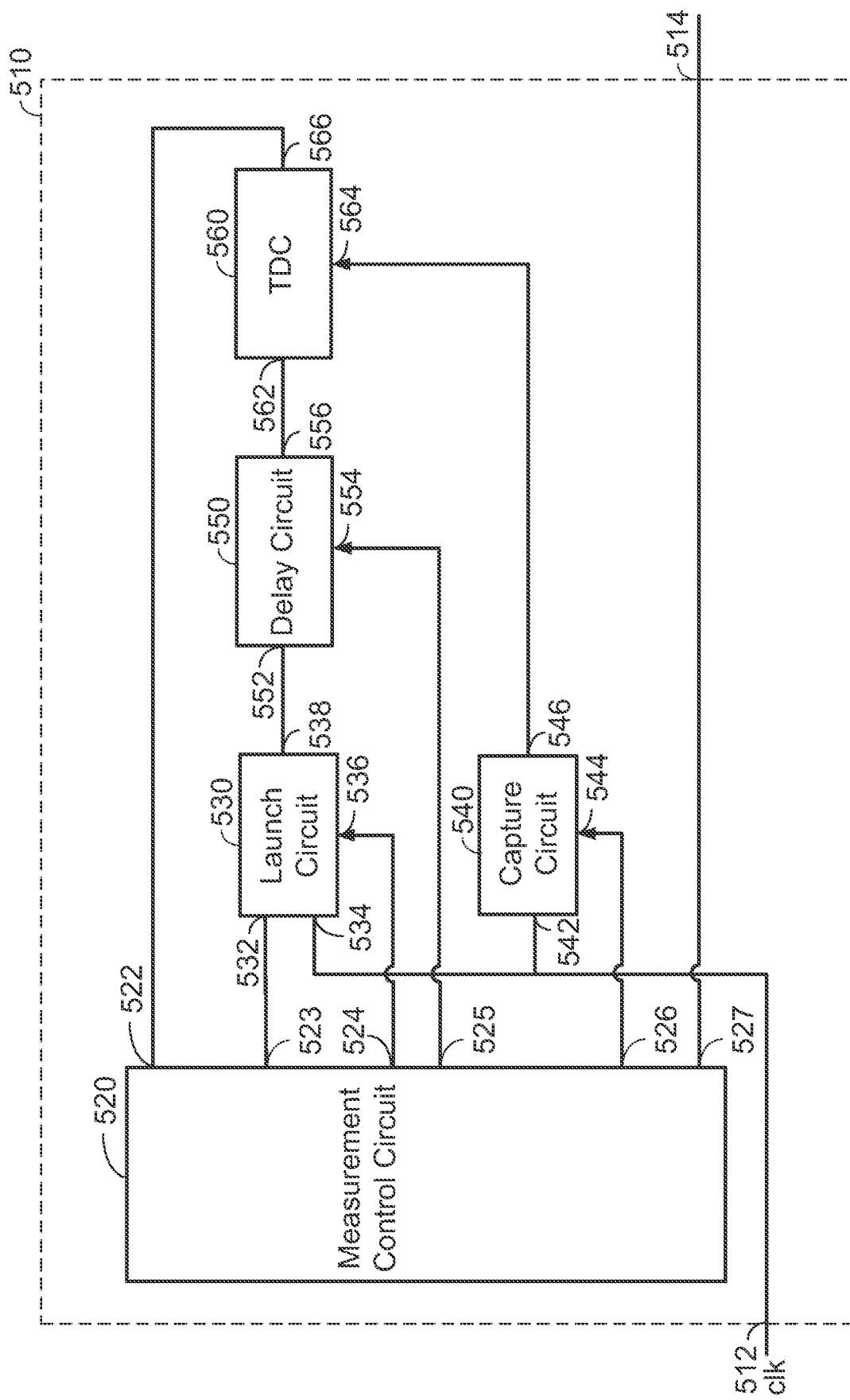
FIG. 5 shows an example of a timing measurement circuit including a time-to-digital converter according to certain aspects of the present disclosure.

FIG. 5 shows an exemplary timing measurement circuit 510 according to certain aspects. The timing measurement circuit 510 may be used to implement the timing measurement circuit 310 in FIG. 3 (i.e., the timing measurement circuit 310 may be an instance of the timing measurement circuit 510).

The timing measurement circuit 510 has an input 512 and an output 514. The timing measurement circuit 510 is configured to receive the clock signal (labeled "clk") via the input 512. In one example, the input 512 may be coupled to a leaf node of a clock distribution network (e.g., the clock distribution network 120). However, it is to be appreciated that the present disclosure is not limited to this example and that the input 512 may be coupled to another node (e.g., a node before the clock distribution network 120, a node within the clock distribution network 120, etc.). The timing measurement circuit 510 is configured to output a measurement signal at the output 514, as discussed further below. For the example where the timing measurement circuit 510 is used to implement the timing measurement circuit 310 in FIG. 3, the input 512 corresponds to the input 312 in FIG. 3 and the output 514 corresponds to the output 314 in FIG. 3. For the example where the input 512 of the timing measurement circuit 510 is coupled to the output 324 of the duty-cycle adjuster 320, the clock signal at the input 512 of the timing measurement circuit 510 may also be referred to as the duty-cycle adjusted clock signal since the duty-cycle adjuster 320 adjusts the duty-cycle of the clock signal received at the input 322 of the duty-cycle adjuster 320. The input 512 of the timing measurement circuit 510 may be coupled to the output 324 of the duty-cycle adjuster 320 via the signal path 125.

In this example, the timing measurement circuit 510 includes a measurement control circuit 520, a launch circuit 530, a delay circuit 550, a time-to-digital converter (TDC) 560, and a capture circuit 540. As discussed further below, the measurement control circuit 520 controls operations of the timing measurement circuit 510.

The launch circuit 530 has an enable input 532, a clock input 534, a control input 536, and an output 538. The enable input 532 is coupled to a first output 523 of the measurement control circuit 520, the clock input 534 is coupled to the input 512 of the timing measurement circuit 510 to receive the clock signal, and the control input 536 is coupled to a second output 524 of the measurement control circuit 520. The launch circuit 530 is configured to receive an enable signal from the measurement control circuit 520 via the enable input 532 to initiate a measurement. In response to the enable signal, the launch circuit 530 launches (i.e., outputs) an edge of a timing signal at the output 538 on an edge of the clock signal. The edge of the clock signal used to launch the edge of the timing signal may be a rising edge or a falling edge. In certain aspects, the launch circuit 530 selects the edge of the clock signal used to launch the edge of the timing signal based on a first edge select signal received from the measurement control circuit 520 via the control input 536. For example, the launch circuit 530 may launch the edge of the timing signal on a rising edge of the clock signal if the first edge select signal has a first logic value and launch the edge of the timing signal on a falling edge of the clock signal if the first edge select signal has a second logic value. The first logic value may be one and the second logic value may be zero, or vice versa. The edge of the timing signal may be a rising edge or a falling edge.

The delay circuit 550 has a signal input 552, a control input 554, and an output 556. The signal input 552 is coupled to the output 538 of the launch circuit 530. The control input 554 is coupled to a third output 525 of the measurement control circuit 520. The delay circuit 550 is configured to receive the edge of the timing signal from the launch circuit 530 via the signal input 552, delay the edge of the timing signal by a time delay, and output the delayed edge of the timing signal at the output 556. In certain aspects, the time delay of the delay circuit 550 is adjustable (i.e., programmable). In these aspects, the delay circuit 550 is configured to set the time delay of the delay circuit 550 based on a delay control signal received from the measurement control circuit 520 via the control input 554.

The capture circuit 540 has a clock input 542, a control input 544, and an output 546. The clock input 542 is coupled to the input 512 of the timing measurement circuit 510 to receive the clock signal, and the control input 544 is coupled to a fourth output 526 of the measurement control circuit 520. The capture circuit 540 is configured to generate a capture signal and output the capture signal at the output 546. In certain aspects, the capture circuit 540 is configured to output an edge of the capture signal on a rising edge or a falling edge of the clock signal based on a second edge select signal received from the measurement control circuit 520 via the control input 544. For example, the capture circuit 540 may output the edge of the capture signal on a rising edge of the clock signal if the second edge select signal has a first logic value and output the edge of the capture signal on a falling edge of the clock signal if the second edge select signal has a second logic value. The first logic value may be one and the second logic value may be zero, or vice versa. The edge of the capture signal may be a rising edge or a falling edge. In certain aspects, the capture signal may be a capture clock signal, as discussed further below.

The TDC 560 has a signal input 562, a capture input 564, and an output 566. The signal input 562 of the TDC 560 is coupled to the output 556 of the delay circuit 550 to receive the delayed edge of the timing signal from the delay circuit 550. The capture input 564 is coupled to the output 546 of the capture circuit 540 to receive the edge of the capture signal from the capture circuit 540. The output 566 of the TDC 560 is coupled to a time-measurement input 522 of the measurement control circuit 520. The TDC 560 is configured to measure the time delay (i.e., elapsed time) between the time the TDC 560 receives the edge of the timing signal at the signal input 562 and the time the TDC 560 receives the edge of the capture signal at the capture input 564, and output a digital time-measurement signal at the output 566 indicating the measured time delay. In this example, the time delay measurement may start on the edge of the timing signal and stop on the edge of the capture signal.

Figure 6:
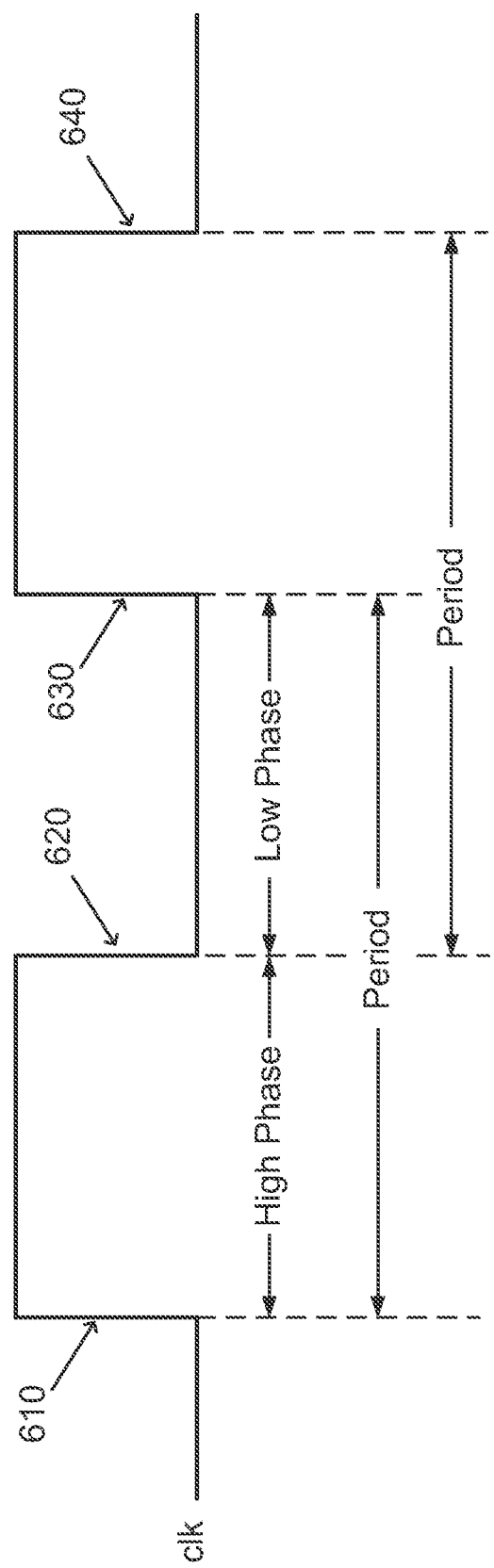
FIG. 6 is a timing diagram showing an example of a clock signal according to certain aspects of the present disclosure.

In certain aspects, the measurement control circuit 520 can measure various timing parameters of the clock signal by selecting the edge of the clock signal used to launch the edge of the timing signal using the first edge select signal and selecting the edge of the clock signal used to output the edge of the capture signal using the second edge select signal. An example of this is illustrated in FIG. 6, which shows an exemplary timing diagram of the clock signal. It is to be appreciated that the clock signal may have a different duty cycle than the duty cycle shown in FIG. 6.

For example, the measurement control circuit 520 may measure a high phase of the clock signal by selecting a rising edge 610 of the clock signal to launch the edge of the timing signal and selecting a falling edge 620 of the clock signal to output the edge of the capture signal. As discussed above, the high phase is the time duration that the clock signal is high (i.e., one) during one clock period. In this example, the high phase starts at the rising edge 610 of the clock signal and ends at the falling edge 620 of the clock signal, as shown in FIG. 6. In this example, the high phase is approximately equal to the sum of the time delay of the delay circuit 550 and the time delay measured by the TDC 560. This is because the high phase is approximately equal to the time delay from the time the edge of the timing signal is launched on the rising edge 610 of the clock signal and the time the edge of the capture signal is output on the falling edge 620 of the clock signal, which is equal to the sum of the time delay of the delay circuit 550 and the time delay measured by the TDC 560. Assuming the time delay of the delay circuit 550 is known, the measurement control circuit 520 may use the measured time delay indicated by the digital time-measurement signal from the TDC 560 and the known time delay of the delay circuit 550 to determine the high phase.

In another example, the measurement control circuit 520 may measure a low phase of the clock signal by selecting a falling edge 620 of the clock signal to launch the edge of the timing signal and selecting a rising edge 630 of the clock signal to output the edge of the capture signal. The low phase is the time duration that the clock signal is low during one clock period. In this example, the low phase starts at the falling edge 620 of the clock signal and ends at the rising edge 630 of the clock signal, as shown in FIG. 6. In this example, the low phase is equal to the sum of the time delay of the delay circuit 550 and the time delay measured by the TDC 560. This is because the low phase is approximately equal to the time delay from the time the edge of the timing signal is launched on the falling edge 620 of the clock signal and the time the edge of the capture signal is output on the rising edge 630 of the clock signal, which is equal to the sum of the time delay of the delay circuit 550 and the time delay measured by the TDC 560. Assuming the time delay of the delay circuit 550 is known, the measurement control circuit 520 may use the measured time delay indicated by the digital time-measurement signal from the TDC 560 and the known time delay of the delay circuit 550 to determine the low phase.

In another example, the measurement control circuit 520 may measure a period of the clock signal by selecting a first rising edge 610 of the clock signal to launch the edge of the timing signal and selecting a second rising edge 630 of the clock signal to output the edge of the capture signal. In this example, the period of the clock signal is approximately equal to the sum of the time delay of the delay circuit 550 and the time delay measured by the TDC 560. This is because the clock period is approximately equal to the time delay from the time the edge of the timing signal is launched on the first rising edge 610 of the clock signal and the time the edge of the capture signal is output on the second rising edge 630 of the clock signal, which is approximately equal to the sum of the time delay of the delay circuit 550 and the time delay measured by the TDC 560. Assuming the time delay of the delay circuit 550 is known, the measurement control circuit 520 may use the measured time delay indicated by the digital time-measurement signal from the TDC 560 and the known time delay of the delay circuit 550 to determine the period of the clock signal.

The measurement control circuit 520 may also measure a period of the clock signal by selecting a first falling edge 620 of the clock signal to launch the edge of the timing signal and selecting a second falling edge 640 of the clock signal to output the edge of the capture signal. In this example, the period of the clock signal is approximately equal to the sum of the time delay of the delay circuit 550 and the time delay measured by the TDC 560. Thus, in this example, the timing measurement circuit 510 supports two approaches for measuring the clock period (i.e., measure the period between two consecutive rising edges of the clock signal or measure the period between two consecutive falling edges of the clock signal). Either approach may be used to measure the clock period, or both approaches may be used to measure the clock period.

Thus, the measurement control circuit 520 can measure any one of one or more timing parameters of the clock signal including a high phase of the clock signal, a low phase of the clock signal, and a period of the clock signal. The measurement control circuit 520 selects the timing parameter to be measured by selecting the launch clock edge (i.e., the edge of the clock signal used to launch the edge of the timing signal) and selecting the capture clock edge (i.e., the edge of the clock signal used to output the edge of the capture signal) accordingly. For example, to measure the high phase, the measurement control circuit 520 selects a rising edge of the clock signal for the launch clock edge, and selects a falling edge of the clock signal for the capture clock edge. In certain aspects, the launch clock edge may also be referred to as a first edge of the clock signal and the capture clock edge may also be referred to as a second edge of the clock signal.

In certain aspects, the measurement control circuit 520 is configured to generate a measurement signal based on the one or more measured timing parameters of the clock signal, and output the measurement signal at a fifth output 527 coupled to the output 514 of the timing measurement circuit 510. In one example, the measurement signal may indicate one or more of the measured high phase of the clock signal, the measured low phase of the clock signal, and the measured period of the clock signal.

In another example, the measurement control circuit 520 may determine a duty cycle of the clock signal based on two or more of the measured high phase of the clock signal, the measured low phase of the clock signal, and the measured period of the clock signal. For example, the measurement control circuit 520 may determine the duty cycle of the clock signal based on a ratio of the measured high phase of the clock signal and the measured period of the clock signal. In this example, a ratio of 0.5 corresponds to a 50% duty cycle. The measurement control circuit 520 may then output a measurement signal indicating the determined duty cycle.

In another example, the measurement control circuit 520 may determine a duty-cycle adjustment for the clock signal based on one or more of the measured high phase of the clock signal, the measured low phase of the clock signal, and the measured period of the clock signal. For example, the clock signal may have a target duty cycle of 50%. In this example, the measurement control circuit 520 may compare the measured high phase of the clock signal with the measured low phase of the clock signal to determine the duty cycle adjustment. For example, if the measured high phase is greater than the measured low phase (which occurs when the duty cycle of the clock signal is greater than the target duty cycle of 50%), then the measurement control circuit 520 may determine a duty-cycle adjustment that decreases the duty cycle of the clock signal to move the duty cycle of the clock signal closer to the target duty cycle of 50%. If, on the other hand, the measured high phase is less than the measured low phase (which occurs when the duty cycle of the clock signal is less than the target duty cycle), the measurement control circuit 520 may determine a duty-cycle adjustment that increases the duty cycle of the clock signal to move the duty cycle of the clock signal closer to the target duty cycle of 50%. The measurement control circuit 520 may then output a measurement signal indicating the determined duty-cycle adjustment. It is to be appreciated that the present disclosure is not limited to this example, and that the measurement control circuit 520 may determine the duty-cycle adjustment in a different manner based on one or more of the measured timing parameters of the clock signal.

It is to be appreciated that the measurement signal may include two or more signals in some implementations. For example, the measurement signal may include a first signal indicating a sign of the duty-cycle adjustment (i.e., indicating whether to increase or decrease the duty cycle of the clock signal) and a second signal indicating the amount by which the duty cycle is to be adjusted. In this example, the first signal and the second signal may be output on one line serially or output on two parallel lines.

The duty-cycle control circuit 330 may receive the measurement signal from the timing measurement circuit 510, determine a duty-cycle adjustment for the duty-cycle adjuster 320 based on the measurement signal, and set the duty-cycle adjustment of the duty-cycle adjuster 320 based on the determined duty-cycle adjustment (i.e., generate the control signal that controls the duty-cycle adjustment of the duty-cycle adjuster 320 based on the determined duty-cycle adjustment and input the control signal to the control input 326 of the duty-cycle adjuster 320). As discussed further below, the duty-cycle adjuster 320 may increase the duty cycle of the clock signal by increasing the high phase of the clock signal or decreasing the low phase of the clock signal, and the duty-cycle adjuster 320 may decrease the duty cycle of the clock signal by decreasing the high phase of the clock signal or increasing the low phase of the clock signal.

For the example where the measurement signal indicates the measured high phase of the clock signal, the duty-cycle control circuit 330 may compare the measured high phase with a target high phase corresponding to a target duty cycle (e.g., 50% duty cycle). If the measured high phase is greater than the target high phase (which occurs when the duty cycle of the clock signal is greater than the target duty cycle), then the duty-cycle control circuit 330 may determine a duty-cycle adjustment for the duty-cycle adjuster 320 that decreases the duty cycle of the clock signal at the node coupled to the input 512 of the timing measurement circuit 510. If, on the other hand, the measured high phase is less than the target high phase (which occurs when the duty cycle of the clock signal is less than the target duty cycle), then the duty-cycle control circuit 330 may determine a duty-cycle adjustment for the duty-cycle adjuster 320 that increases the duty cycle of the clock signal at the node coupled to the input 512 of the timing measurement circuit 510.

For the example where the measurement signal indicates the measured low phase of the clock signal, the duty-cycle control circuit 330 may compare the measured low phase with a target low phase corresponding to a target duty cycle (e.g., 50% duty cycle). If the measured low phase is greater than the target low phase (which occurs when the duty cycle of the clock signal is less than the target duty cycle), then the duty-cycle control circuit 330 may determine a duty-cycle adjustment for the duty-cycle adjuster 320 that increases the duty cycle of the clock signal at the node coupled to the input 512 of the timing measurement circuit 510. If, on the other hand, the measured low phase is less than the target low phase (which occurs when the duty cycle of the clock signal is greater than the target duty cycle), then the duty-cycle control circuit 330 may determine a duty-cycle adjustment for the duty-cycle adjuster 320 that decreases the duty cycle of the clock signal at the node coupled to the input 512 of the timing measurement circuit 510.

For the example where the measurement signal indicates a duty-cycle adjustment based on one or more of the measured timing parameters of the clock signal, the duty-cycle control circuit 330 sets the duty-cycle adjustment of the duty-cycle adjuster 320 based on the indicated duty-cycle adjustment.

For the example where the measurement signal indicates both the measured high phase of the clock signal and the measured low phase of the clock signal, and the target duty cycle is 50%, the duty-cycle control circuit 330 may compare the measured high phase with the measured low phase of the clock signal to determine the duty cycle adjustment. For example, if the measured high phase is greater than the measured low phase (which occurs when the duty cycle of the clock signal is greater than the target duty cycle of 50%), then the duty-cycle control circuit 330 may determine a duty-cycle adjustment that decreases the duty cycle of the clock signal at the node coupled to the input 512 of the timing measurement circuit 510. If, on the other hand, the measured high phase is less than the measured low phase (which occurs when the duty cycle of the clock signal is less than the target duty cycle), then the duty-cycle control circuit 330 may determine a duty-cycle adjustment that increases the duty cycle of the clock signal at the node coupled to the input 512 of the timing measurement circuit 510.

For the example where the measurement signal indicates the duty cycle of the clock signal, the duty-cycle control circuit 330 may compare the indicated duty cycle with a target duty cycle to determine the duty cycle adjustment. For example, if the indicated duty cycle is greater than the target duty cycle, then the duty-cycle control circuit 330 may determine a duty-cycle adjustment that decreases the duty cycle of the clock signal at the node coupled to the input 512 of the timing measurement circuit 510. If the indicated duty cycle is less than the target duty cycle, then the duty-cycle control circuit 330 may determine a duty-cycle adjustment that increases the duty cycle of the clock signal at the node coupled to the input 512 of the timing measurement circuit 510.

Figure 7:
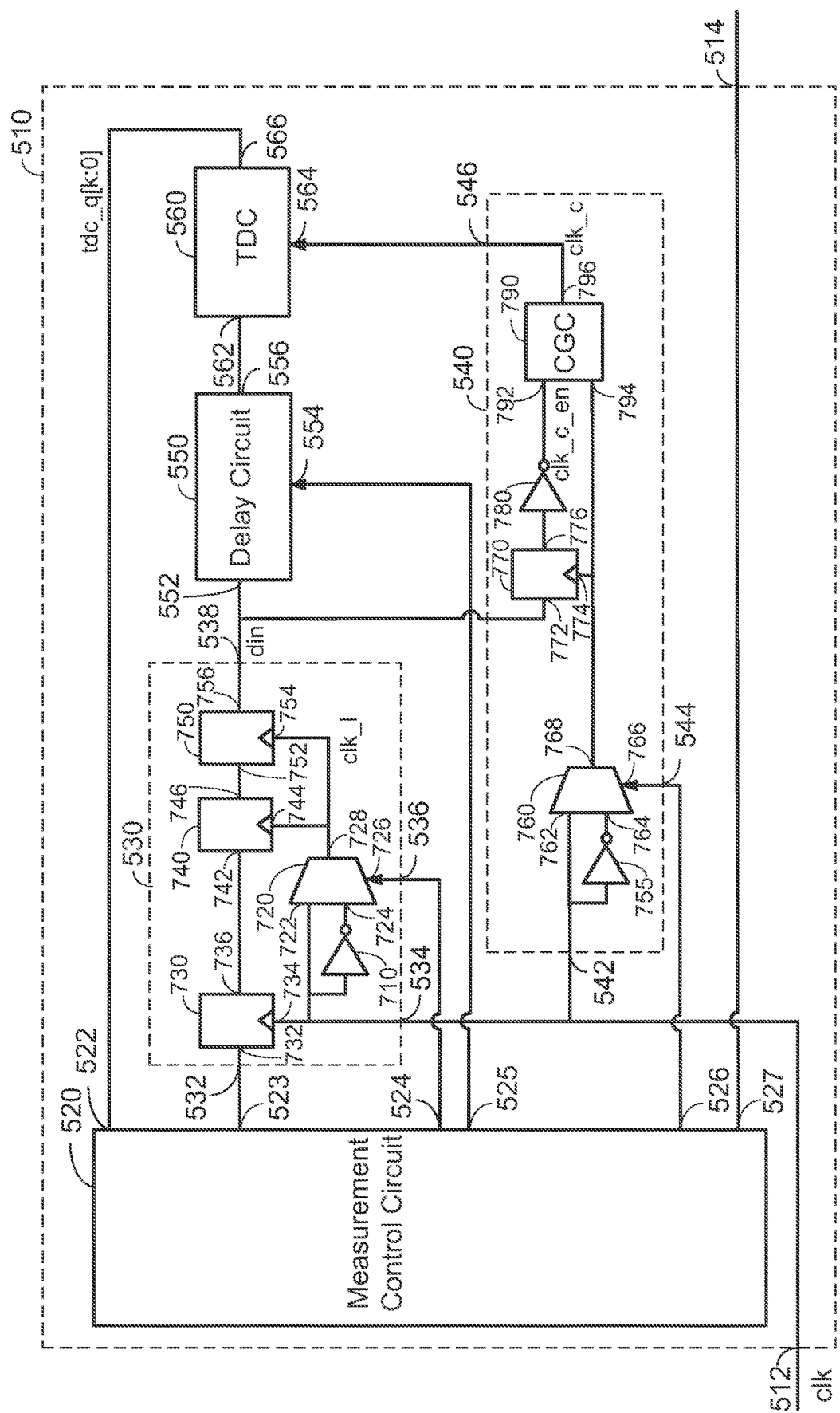
FIG. 7 shows an exemplary implementation of a launch circuit and a capture circuit according to certain aspects of the present disclosure.

FIG. 7 shows an exemplary implementation of the launch circuit 530 and the capture circuit 540 according to certain aspects.

In this example, the launch circuit 530 includes an inverter 710, a multiplexer 720, a first flip-flop 730, a second flip-flop 740, and a launch flip-flop 750. The multiplexer 720 has a first input 722, a second input 724, a select input 726, and an output 728. The first input 722 is coupled to the clock input 534 of the launch circuit 530, and the select input 726 is coupled to the control input 536 of the launch circuit 530. The inverter 710 is coupled between the clock input 534 of the launch circuit 530 and the second input 724 of the multiplexer 720. Thus, the first input 722 of the multiplexer 720 receives the clock signal and the second input 724 of the multiplexer 720 receives the inverted clock signal. The multiplexer 720 is configured to select the clock signal at the first input 722 or the inverted clock signal at the second input 724 based on the control signal at the select input 726, and output the selected one of the clock signal and inverted clock signal at the output 728. The selected one of the clock signal and the inverted clock signal at the output 728 is referred to as the launch clock signal (labeled "clk_l") in the discussion below. As discussed further below, the multiplexer 720 allows the measurement control circuit 520 to select a rising clock edge or a falling clock edge to launch the edge of the timing signal.

The first flip-flop 730 has a signal input 732 coupled to the enable input 532 of the launch circuit 530, a clock input 734 coupled to the clock input 534 of the launch circuit 530, and an output 736. The second flip-flop 740 has a signal input 742 coupled to the output 736 of the first flip-flop 730, a clock input 744 coupled to the output 728 of the multiplexer 720, and an output 746. The launch flip-flop 750 has a signal input 752 coupled to the output 746 of the second flip-flop 740, a clock input 754 coupled to the output 728 of the multiplexer 720, and an output 756 coupled to the output 538 of the launch circuit 530.

In this example, the launch circuit 530 uses the enable signal from the measurement control circuit 520 to provide the timing signal, and launches the edge of the timing signal on either a rising edge or a falling edge of the clock signal depending on whether the multiplexer 720 selects the clock signal or the inverted clock signal. In one example, the enable signal from the measurement control circuit 520 is set high to initiate a duty-cycle measurement. In this example, the rising edge of the enable signal propagates to the signal input 752 of the launch flip-flop 750 through the first flip-flop 730 and the second flip-flop 740, in which the first flip-flop 730 is clocked by the clock signal and the second flip-flop 740 is clocked by the launch clock signal (i.e., the selected one of the clock signal and the inverted clock signal).

The launch flip-flop 750 is configured to launch the rising edge of the enable signal on a rising edge of the launch clock signal (labeled "clk_l"). In this example, the rising edge of the enable signal provides the rising edge of the timing signal (labeled "din"). For the case where the clock signal is selected by the multiplexer 720, the launch flip-flop 750 launches the edge of the timing signal (i.e., rising edge of the enable signal in this example) on a rising edge of the clock signal. For the case where the inverted clock signal is selected by the multiplexer 720, the launch flip-flop 750 launches the edge of the timing signal (i.e., rising edge of the enable signal in this example) on a falling edge of the clock signal.

Thus, in this example, the launch circuit 530 launches the edge of the timing signal in response to receiving the enable signal from the measurement control circuit 520, and launches the edge of the timing signal on either a rising edge or falling edge of the clock signal depending on whether the multiplexer 720 selects the clock signal or the inverted clock signal.

In the example in FIG. 7, the enable signal propagates through the first flip-flop 730 and the second flip-flop 740 to reach the signal input 752 of the launch flip-flop 750. In this example, the first flip-flop 730 and the second flip-flop 740 may be used to adjust the timing of the rising edge of the enable signal to help ensure that the rising edge of the enable signal meets timing (e.g., setup time and/or hold time) at the launch flip-flop 750. It is to be appreciated that the present disclosure is not limited to this example, and that one or both of the first flip-flop 730 and the second flip-flop 740 may be omitted in some implementations (e.g., implementations where timing of the enable signal is not an issue).

In the example in FIG. 7, the capture circuit 540 includes a first inverter 755, a multiplexer 760, a flip-flop 770, a second inverter 780, and a clock gating circuit 790 (also referred to as a clock gating cell). The multiplexer 760 has a first input 762, a second input 764, a select input 766, and an output 768. The first input 762 is coupled to the clock input 542 of the capture circuit 540, and the select input 766 is coupled to the control input 544 of the capture circuit 540. The first inverter 755 is coupled between the clock input 542 of the capture circuit 540 and the second input 764 of the multiplexer 760. Thus, the first input 762 of the multiplexer 760 receives the clock signal and the second input 764 of the multiplexer 760 receives the inverted clock signal. The multiplexer 760 is configured to select the clock signal at the first input 762 or the inverted clock signal at the second input 764 based on the second edge select signal at the select input 766, and output the selected one of the clock signal and the inverted clock signal at the output 768. The selected one of the clock signal and the inverted clock signal at the output 768 is referred to as the capture clock signal in the discussion below. As discussed further below, the multiplexer 760 allows the measurement control circuit 520 to select a rising edge or a falling clock edge to output the edge of the capture clock signal.

The flip-flop 770 has a signal input 772 coupled to the output 538 of the launch circuit 530, a clock input 774 coupled to the output 768 of the multiplexer 760, and an output 776. The input of the second inverter 780 is coupled to the output 776 of the flip-flop 770.

The clock gating circuit 790 has a enable input 792 coupled to the output of the second inverter 780, a signal input 794 coupled to the output 768 of the multiplexer 760, and an output 796 coupled to the capture input 564 of the TDC 560. The clock gating circuit 790 is configured to either pass or gate the capture clock signal from the multiplexer 760 (i.e., the selected one of the clock signal and the inverted clock signal) based on the logic value at the enable input 792. For example, the clock gating circuit 790 may pass the capture clock signal when the enable input 792 is high and gate (i.e., block) the capture signal when the enable input 792 is low, or vice versa in an alternate implementation. The capture clock signal after the clock gating circuit 790 is labeled "clk_c" in FIG. 7.

In this example, the capture circuit 540 uses the capture clock signal output at the output 546 to provide the capture signal discussed above. The edge of the clock signal used to output the edge of the capture clock signal depends on whether the multiplexer 760 selects the clock signal or the inverted clock signal. For example, the edge of the capture clock signal may be output on a rising edge of the clock signal when the multiplexer 760 selects the clock signal and the edge of the capture clock signal may be output on a falling edge of the clock signal when the multiplexer 760 selects the inverted clock signal.

The flip-flop 770 and the second inverter 780 are used to gate the capture clock signal after the edge of the capture clock signal. This is done so that the TDC 560 holds the time delay measurement at the output 566 of the TDC 560 after the edge of the capture clock signal.

Figure 8A:
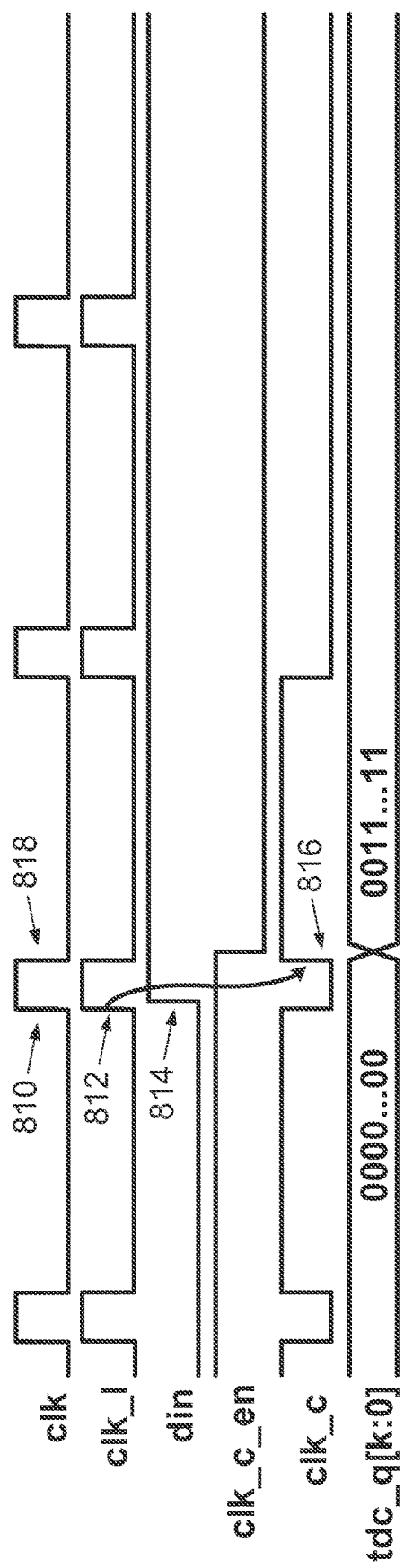
FIG. 8A is a timing diagram showing an example of a high-phase measurement according to certain aspects of the present disclosure.

The exemplary launch circuit 530 and capture circuit 540 shown in FIG. 7 may be used to measure any one of a high phase of the clock signal, a low phase of the clock signal, and a period of the clock signal. In this regard, FIG. 8A is a timing diagram showing an example of a high-phase measurement of the clock signal according to certain aspects. FIG. 8A shows an example of the clock signal (labeled "clk"), the launch clock signal (labeled "clk_l"), the timing signal (labeled "din"), the signal (labeled "clk_csen") at the enable input 792 of the clock gating circuit 790, the capture clock signal (labeled "clk_c") at the output of the clock gating circuit 790, and the output of the TDC 560 (labeled "tdc_q").

In the example in FIG. 8A, the multiplexer 720 in the launch circuit 530 selects the clock signal and the multiplexer 760 in the capture circuit 540 selects the inverted clock signal. Thus, in this example, the launch clock signal is provided by the clock signal and the capture clock signal is provided by the inverted clock signal. In this example, the launch flip-flop 750 launches a rising edge 814 of the timing signal (labeled "din") on a rising edge 812 of the launch clock signal (labeled "clk_l"), which corresponds to a rising edge 810 of the clock signal. In this example, the launch flip-flop 750 is a rising-edge triggered flip-flop (also referred to as a positive-edge triggered flip-flop). The rising edge 814 of the timing signal propagates through the delay circuit 550 and into the TDC 560.

The capture circuit 540 outputs a rising edge 816 of the capture clock signal on a falling edge 818 of the clock signal. Note that the capture circuit 540 generates the capture clock signal (labeled "clk_c") in this example. The rising edge 816 of the capture clock signal causes the TDC 560 to capture a time delay measurement of the timing signal in the TDC 560 and output the corresponding digital time-measurement signal (labeled "tdc_q") to the measurement control circuit 520. In this example, the TDC 560 is rising-edge triggered (i.e., captures a time delay measurement on a rising edge of the capture clock signal).

After the rising edge 816 of the capture clock signal, the signal (labeled "clk_c_en") at the enable input 792 of the clock gating circuit 790 goes low. This causes the clock gating circuit 790 to gate the capture clock signal and the TDC 560 to hold the time-delay measurement. The TDC 560 may hold the time-delay measurement until the measurement control circuit 520 resets the launch circuit 530 and the capture circuit 540 (e.g., by outputting a zero to the enable input 532 of the launch circuit 530).

Figure 8B:
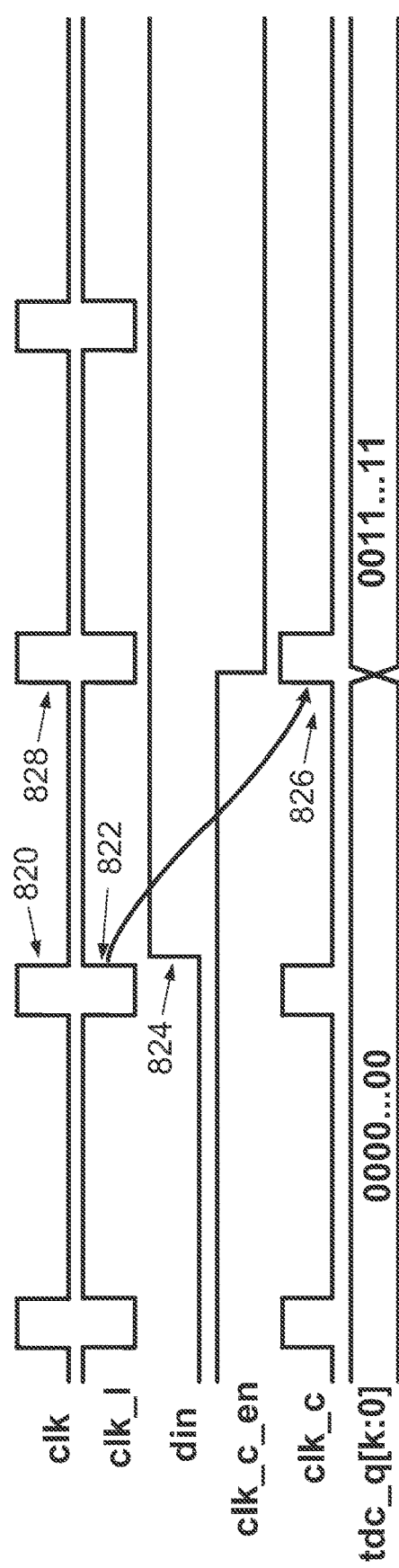
FIG. 8B is a timing diagram showing an example of a low-phase measurement according to certain aspects of the present disclosure.

FIG. 8B is a timing diagram showing an example of a low-phase measurement of the clock signal according to certain aspects. In the example in FIG. 8B, the multiplexer 720 in the launch circuit 530 selects the inverted clock signal and the multiplexer 760 in the capture circuit 540 selects the clock signal. Thus, in this example, the launch clock signal is provided by the inverted clock signal and the capture clock signal is provided by the clock signal. In this example, the launch flip-flop 750 launches a rising edge 824 of the timing signal (labeled "din") on a rising edge 822 of the launch clock signal (labeled "clk_l"), which corresponds to a falling edge 820 of the clock signal. The rising edge 824 of the timing signal propagates through the delay circuit 550 and into the TDC 560.

The capture circuit 540 outputs a rising edge 826 of the capture clock signal on a rising edge 828 of the clock signal. Note that the capture circuit 540 generates the capture clock signal (labeled "clk_c") in this example. The rising edge 826 of the capture clock signal causes the TDC 560 to capture a time delay measurement of the timing signal in the TDC 560 and output the corresponding digital time-measurement signal (labeled "tdc_q") to the measurement control circuit 520.

After the rising edge 826 of the capture clock signal, the signal (labeled "clk_c_en") at the enable input 792 of the clock gating circuit 790 goes low. This causes the clock gating circuit 790 to gate the capture clock signal and the TDC 560 to hold the time-delay measurement. The TDC 560 may hold the time-delay measurement until the measurement control circuit 520 resets the launch circuit 530 and the capture circuit 540 (e.g., by outputting a zero to the enable input 532 of the launch circuit 530).

Figure 8C:
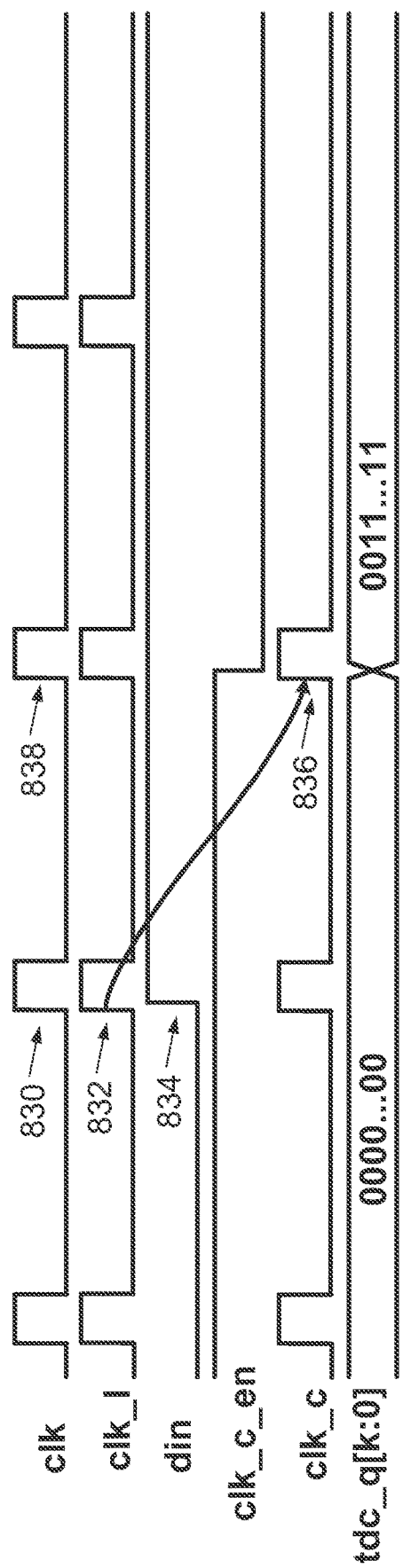
FIG. 8C is a timing diagram showing an example of a clock period measurement according to certain aspects of the present disclosure.

FIG. 8C is a timing diagram showing an example of a clock period measurement according to certain aspects. In the example in FIG. 8C, the multiplexer 720 in the launch circuit 530 selects the clock signal and the multiplexer 760 in the capture circuit 540 selects the clock signal. Thus, in this example, the launch clock signal is provided by the clock signal and the capture clock signal is provided by the clock signal. In this example, the launch flip-flop 750 launches a rising edge 834 of the timing signal (labeled "din") on a rising edge 832 of the launch clock signal (labeled "clk_l"), which corresponds to a rising edge 830 of the clock signal. The rising edge 834 of the timing signal propagates through the delay circuit 550 and into the TDC 560.

The capture circuit 540 outputs a rising edge 836 of the capture clock signal on a rising edge 838 of the clock signal. Note that the capture circuit 540 generates the capture clock signal (labeled "clk_c") in this example. The rising edge 836 of the capture clock signal causes the TDC 560 to capture a time delay measurement of the timing signal in the TDC 560 and output the corresponding digital time-measurement signal (labeled "tdc_q") to the measurement control circuit 520.

After the rising edge 836 of the capture clock signal, the signal (labeled "clk_c_en") at the enable input 792 of the clock gating circuit 790 goes low. This causes the clock gating circuit 790 to gate the capture clock signal and the TDC 560 to hold the time-delay measurement. The TDC 560 may hold the time-delay measurement until the measurement control circuit 520 resets the launch circuit 530 and the capture circuit 540 (e.g., by outputting a zero to the enable input 532 of the launch circuit 530).

Figure 8D:
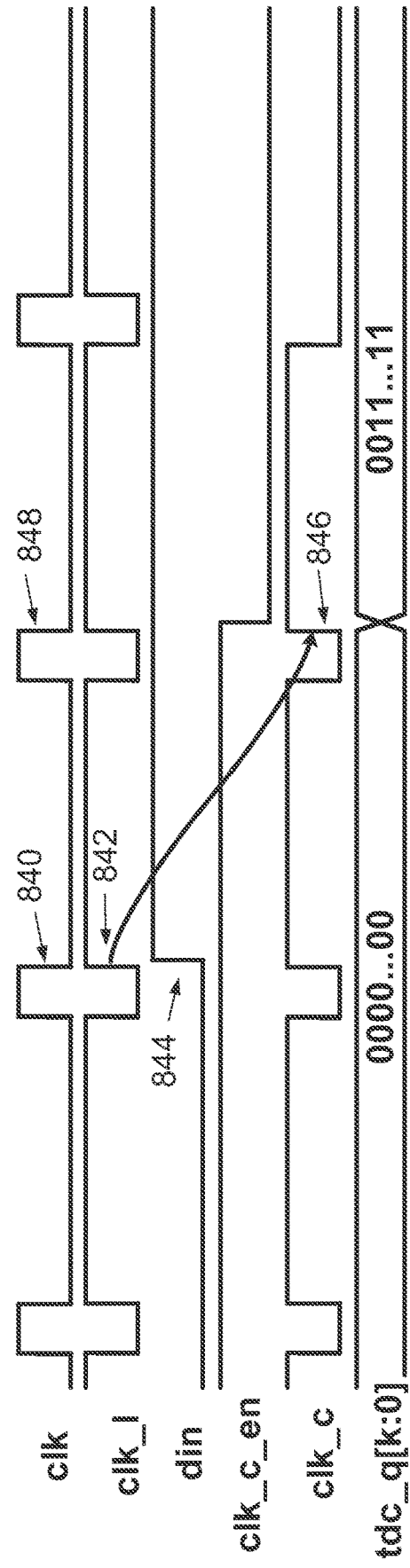
FIG. 8D is a timing diagram showing another example of a clock period measurement according to certain aspects of the present disclosure.

FIG. 8D is a timing diagram showing another example of a clock period measurement according to certain aspects. In the example in FIG. 8D, the multiplexer 720 in the launch circuit 530 selects the inverted clock signal and the multiplexer 760 in the capture circuit 540 selects the inverted clock signal. Thus, in this example, the launch clock signal is provided by the inverted clock signal and the capture clock signal is provided by the inverted clock signal. In this example, the launch flip-flop 750 launches a rising edge 844 of the timing signal (labeled "din") on a rising edge 842 of the launch clock signal (labeled "clk_l"), which corresponds to a falling edge 840 of the clock signal. The rising edge 844 of the timing signal propagates through the delay circuit 550 and into the TDC 560.

The capture circuit 540 outputs a rising edge 846 of the capture clock signal on a falling edge 848 of the clock signal.

Note that the capture circuit 540 generates the capture clock signal (labeled "clk_c") in this example. The rising edge 846 of the capture clock signal causes the TDC 560 to capture a time delay measurement of the timing signal in the TDC 560 and output the corresponding digital time-measurement signal (labeled "tdc_q") to the measurement control circuit 520.

After the rising edge 846 of the capture clock signal, the signal (labeled "clk_c_en") at the enable input 792 of the clock gating circuit 790 goes low. This causes the clock gating circuit 790 to gate the capture clock signal and the TDC 560 to hold the time-delay measurement. The TDC 560 may hold the time-delay measurement until the measurement control circuit 520 resets the launch circuit 530 and the capture circuit 540 (e.g., by outputting a zero to the enable input 532 of the launch circuit 530).

Figure 9:
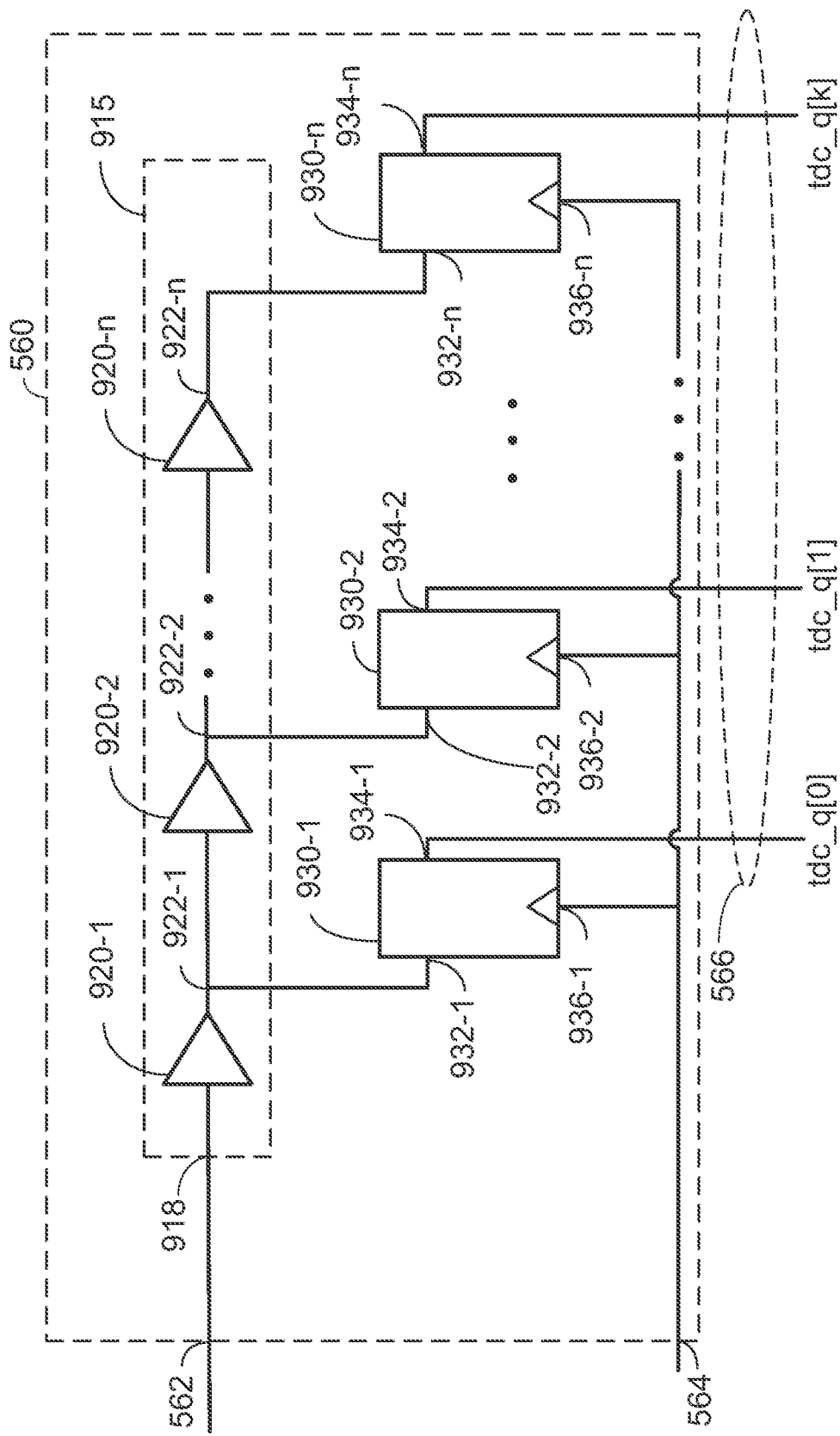
FIG. 9 shows an exemplary implementation of a time-to-digital converter according to certain aspects of the present disclosure.

FIG. 9 shows an exemplary implementation of the TDC 560 according to certain aspects. In this example, the TDC 560 is configured to receive the timing signal at the signal input 562 and measure the time delay between the time the edge of the timing signal is received at the signal input 562 of the TDC 560 and the time the edge of the capture clock signal is received at the capture input 564 of the TDC 560. In this example, the digital time-measurement signal (labeled "tdc_q") includes multiple bits (labeled "tdc_q[0]" to "tdc_q[k]") indicating the measured time delay.

In the example in FIG. 9, the TDC 560 includes a delay line 915 and multiple flip-flops 930-1 to 930-$n$ coupled to the delay line 915. The flip-flops 930-1 to 930-$n$ are clocked by the capture clock signal received at the capture input 564. The delay line 915 has an input 918 coupled to the signal input 562 of the TDC 560 and multiple nodes 922-1 to 922-$n$ where each node corresponds to a different delay along the delay line 915. In the example in FIG. 9, the delay line 915 includes multiple delay buffers 920-1 to 920-$n$ coupled in series in which the output of each of the delay buffers 920-1 to 920-$n$ corresponds to a respective one of the nodes 922-1 to 922-$n$. In operation, the timing signal received by the TDC 560 propagates through the delay line 915. The output of each delay buffer 920-1 to 920-$n$ provides a different delayed-version of the timing signal at the respective node 922-1 to 922-$n$.

Each of the flip-flops 930-1 to 930-$n$ has a signal input 932-1 to 932-$n$, an output 934-1 to 934-$n$, and a clock input 936-1 to 936-$n$. The clock input 936-1 to 936-$n$ of each flip-flop 930-1 to 930-$n$ is coupled to the capture input 564 and configured to receive the capture clock signal. Each flip-flop 930-1 to 930-$n$ is configured to latch the bit value at the respective signal input 932-1 to 932-$n$ on the edge of the capture clock signal, and output the latched bit value at the respective output 934-1 to 934-$n$. The edge of the capture clock signal may be a rising edge for the example where the flip-flops 930-1 to 930-$n$ are implemented with rising-edge-triggered flip-flops. Note that the edge of the capture clock signal is a rising edge in the example shown in FIGS. 8A to 8D. However, it is to be appreciated that the present disclosure is not limited to this example.

The signal input 932-1 to 932-$n$ of each flip-flop 930-1 to 930-$n$ is coupled to a respective one of the nodes 922-1 to 922-$n$ on the delay line 915. Thus, the signal input 932-1 to 932-$n$ of each flip-flop 930-1 to 930-$n$ receives a different delayed-version of the timing signal. In the example in FIG. 9, the signal input 932-1 to 932-$n$ of each flip-flop 930-1 to 930-$n$ is coupled to the output of a respective one of the delay buffers 920-1 to 920-$n$. The output 934-1 to 934-$n$ of each flip-flop 930-1 to 930-$n$ provides a respective one of the bits (labeled "tdc_q[0]" to "tdc_q[k]") of the digital time-measurement signal (labeled "tdc_q"). In this example, each flip-flop 930-1 to 930-$n$ latches the bit value at the respective node 922-1 to 922-$n$ on the edge of the capture clock signal (e.g., rising edge of the capture clock signal), and outputs the latched bit value as the bit value for the respective bit of the digital time-measurement signal (labeled "tdc_q").

In this example, the time delay of the timing signal is indicated by the number of the bits (labeled "tdc_q[0]" to "tdc_q[k]") of the digital time-measurement signal that are one. The greater the number of bits that are one, the longer the time delay. This is because the number of bits that are one is greater when the timing signal propagates farther down the delay line 915, which occurs when the time delay is longer.

In this example, the TDC 560 measures the time delay of the timing signal in a time increment that is equal to the delay of one delay buffer, which provides much higher resolution than the resolution provided by the RO-based timing measurement circuit 410. This is because the ring oscillator 430 includes multiple delay buffers coupled in a loop, in which the RO signal needs to propagate through the multiple delay buffers twice to generate each oscillation of the RO signal. As a result, the time increment in the RO-based timing measurement circuit 410 is equal to the twice the sum of the delays of the multiple delay buffers in the ring oscillator 430. Thus, the time increment with which the RO-based timing measurement circuit 410 measures time delay is much greater than the TDC 560, resulting in much lower resolution for the RO-based timing measurement circuit 410.

It is to be appreciated that the timing measurement circuit 510 is not limited to the examples shown in FIGS. 5 and 7. For example, in some implementations, the delay circuit 550 may have a fixed time delay or the delay circuit 550 may be omitted (e.g., for the case where the TDC 560 has a time measurement range spanning a clock period). For implementations where the delay circuit 550 is omitted, the signal input 562 of the TDC 560 may be directly coupled to the output 538 of the launch circuit 530.

Figure 10:
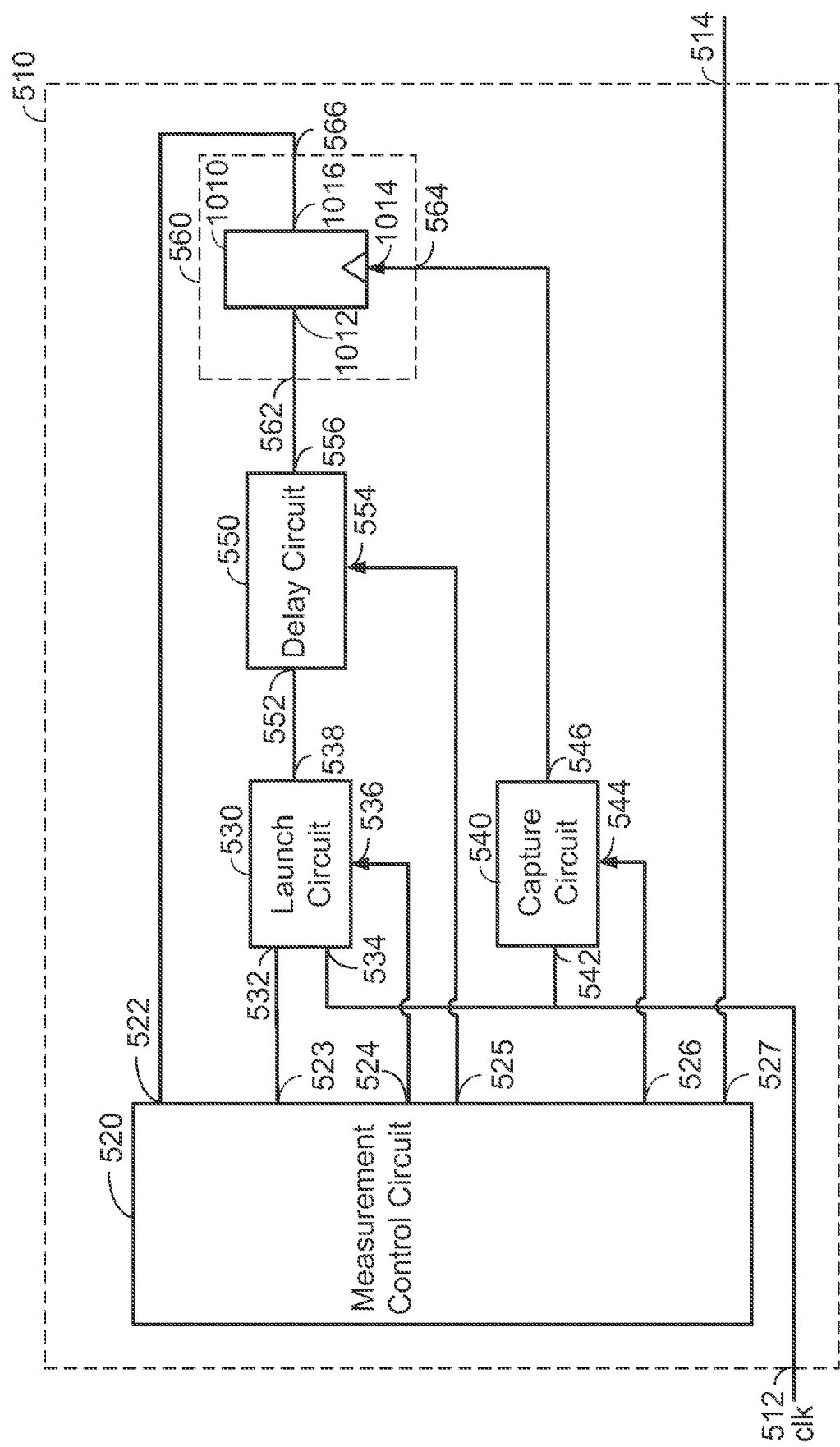
FIG. 10 shows another exemplary implementation of a time-to-digital converter according to certain aspects of the present disclosure.

FIG. 10 shows another exemplary implementation of the TDC 560 according to certain aspects. In this example, the TDC 560 includes a flip-flop 1010 having a signal input 1012, a clock input 1014, and an output 1016. The signal input 1012 is coupled to the signal input 562 of the TDC 560, the clock input 1014 is coupled to the capture input 564 of the TDC 560, and the output 1016 is coupled to the output 566 of the TDC 560.

In this example, the flip-flop 1010 is clocked by the capture clock signal received at the capture input 564 of the TDC 560. The flip-flop 1010 is configured to latch the logic value at the signal input 1012 on the edge (e.g., rising edge) of the capture clock signal, and output the latched logic value to the measurement control circuit 520. Thus, in this example, the latched logic value provides the digital time-measurement signal output by the TDC 560.

In this example, the latched logic value output by the flip-flop 1010 indicates whether the edge of the timing signal reaches the TDC 560 by the time the edge of the capture clock signal is received at clock input 1014. For example, if the edge of the timing signal is a rising edge (as shown in the examples in FIGS. 8A to 8D), then the latched logic value is one if the edge of the timing signal arrives before the edge of the capture clock signal and zero if the edge of the timing signal arrives after the edge of the capture clock signal. Since the edge of the timing signal arrives at the TDC 560 after the time delay of the delay circuit 550, the latched value output by the flip-flop 1010 indicates whether the time delay of the delay circuit 550 is less than or greater than the time delay between the launch clock edge and the capture clock edge. This information may be used to measure the high phase, the low phase, or the period of the clock signal by sequentially adjusting the time delay of the delay circuit 550 to different delay settings and observing the latched logic value for each delay setting, as discussed further below.

To measure the high phase of the clock signal in this example, the measurement control circuit 520 may select a rising edge for the launch clock edge using the first edge select signal and select a falling edge for the capture clock edge using the second edge select signal. The measurement control circuit 520 may then sequentially adjust the time delay of the delay circuit 550 to different delay settings using the delay control signal. For each delay setting, the measurement control circuit 520 initiates a measurement and receives a latched logic value from the TDC 560 indicating whether the time delay of the delay circuit 550 is less than or greater than the high phase of the clock signal. For example, for the example where the edge of the timing signal is a rising edge, the latched value is zero when the time delay of the delay circuit 550 is greater than the high phase and one when the time delay of the delay circuit 550 is less than the high phase. In this example, the measurement control circuit 520 may determine the high phase by determining the highest delay setting at which the latched value is one and the lowest delay setting at which the latched value is zero. In this case, the high phase of the clock signal may be between the time delay corresponding to the highest delay setting at which the latched value is one and the time delay corresponding to the lowest delay setting at which the latched value is zero. The measurement control circuit 520 may then estimate the high phase to be equal to one of the two time delays. Alternately, the measurement control circuit 520 may estimate the high phase to be equal to a time delay between the two time delays. Thus, in this example, the measurement control circuit 520 measures the high phase by sequentially adjusting the time delay of the delay circuit 550 to different delay settings and observing the latched logic value for each delay setting to determine a time delay approximately equal to the high phase.

In this example, the low phase and the clock period may each be measured in a similar manner as the high phase discussed above. For a low-phase measurement, the measurement control circuit 520 may select a falling edge for the launch clock edge using the first edge select signal and select a rising edge for the capture clock edge using the second edge select signal. For a clock period measurement, the measurement control circuit 520 may select a rising edge for the launch clock edge and a rising edge for the capture clock edge, or select a falling edge for the launch clock edge and a falling edge of the capture clock edge.

Figure 11:
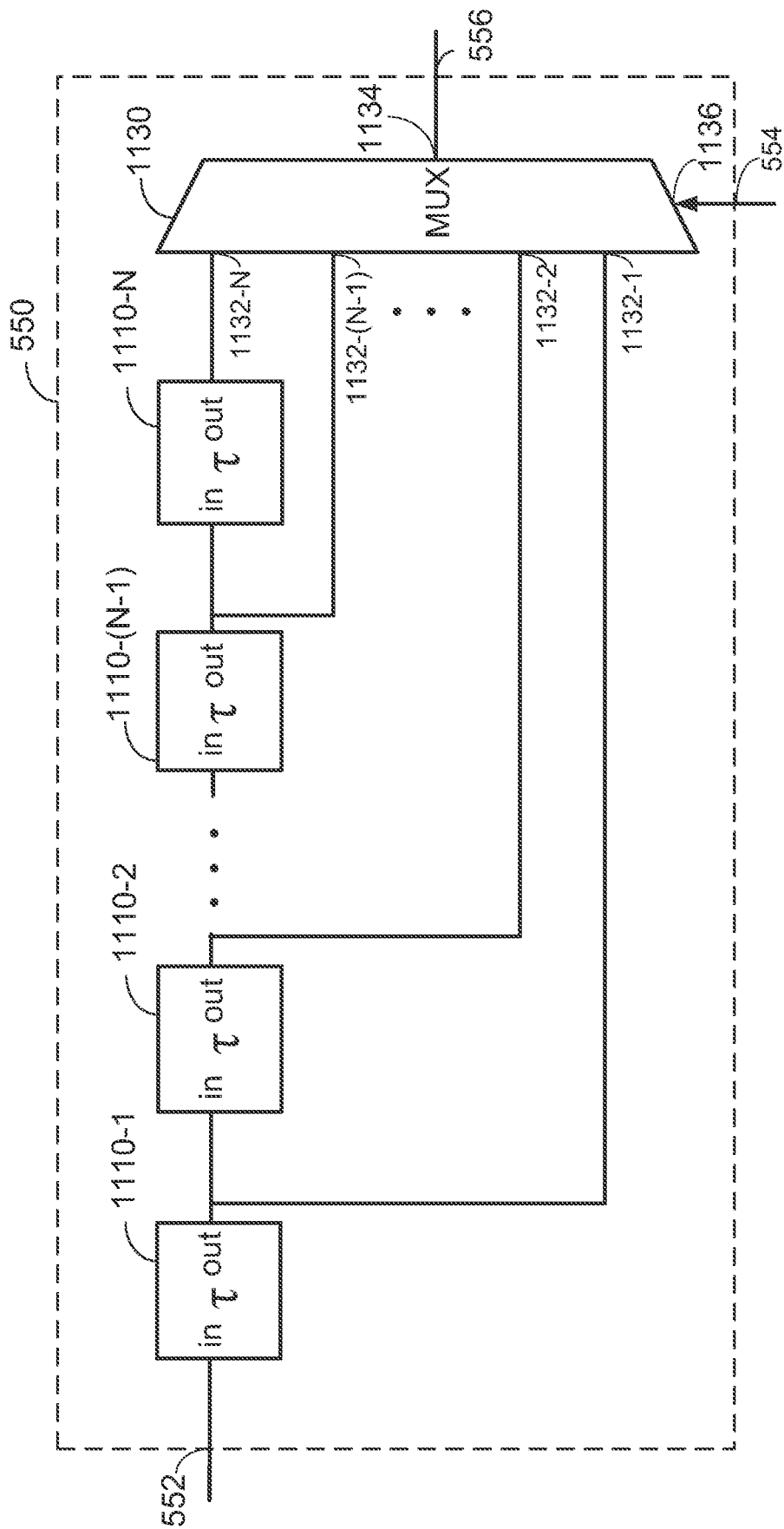
FIG. 11 shows an exemplary implementation of a delay circuit according to certain aspects of the present disclosure.

FIG. 11 shows an exemplary implementation of the delay circuit 550 according to certain aspects of the present disclosure. In this example, the delay circuit 550 includes multiple delay devices 1110-1 to 1110-N coupled in series to form a delay line (e.g., delay chain). Each of the delay devices 1110-1 to 1110-N has a respective input (labeled "in") and a respective output (labeled "out"). Each of the delay devices 1110-1 to 1110-N may have approximately the same delay of τ. The input of delay device 1110-1 is coupled to the signal input 552 of the delay circuit 550. The output of each of delay devices 1110-1 to 1110-(N−1) is coupled to the input of the next delay device 1110-2 to 1110-N in the delay line. Each of the delay devices 1110-1 to 1110-N may also be referred to as a delay stage, a delay element, a delay unit, a delay buffer, or another term.

The delay circuit 550 also includes a multiplexer 1130 having multiple inputs 1132-1 to 1132-N, an output 1134, and a select input 1136. Each of the inputs 1132-1 to 1132-N of the multiplexer 1130 is coupled to the output of a respective one of the delay devices 1110-1 to 1110-N in the delay line. As a result, each of the inputs 1132-1 to 1132-N is coupled to a different point on the delay line corresponding to a different time delay. The output 1134 of the multiplexer 1130 is coupled to the output 556 of the delay circuit 550, and the select input 1136 of the multiplexer 1130 is coupled to the control input 554 of the delay circuit 550.

The multiplexer 1130 is configured to receive the delay control signal at the select input 1136 from the measurement control circuit 520 and select one of the inputs 1132-1 to 1132-N of the multiplexer 1130 based on the received delay control signal, in which the selected one of the inputs 1132-1 to 1132-N is coupled to the output 1134 of the multiplexer 1130. Because each of the inputs 1132-1 to 1132-N is coupled to a different point on the delay line corresponding to a different time delay, the delay control signal controls the time delay of the delay circuit 550 by controlling which one of the inputs 1132-1 to 1132-N is selected by the multiplexer 1130.

It is to be appreciated that the delay circuit 550 is not limited to the exemplary implementation shown in FIG. 11. In general, the delay circuit 550 may include multiple delay devices and circuitry for selectively switching the delay devices in and out of the delay path between the signal input 552 and the output 556 of the delay circuit 550 based on the delay control signal. The circuitry may include switches, one or more multiplexers, logic gates, or any combination thereof.

Figure 12:
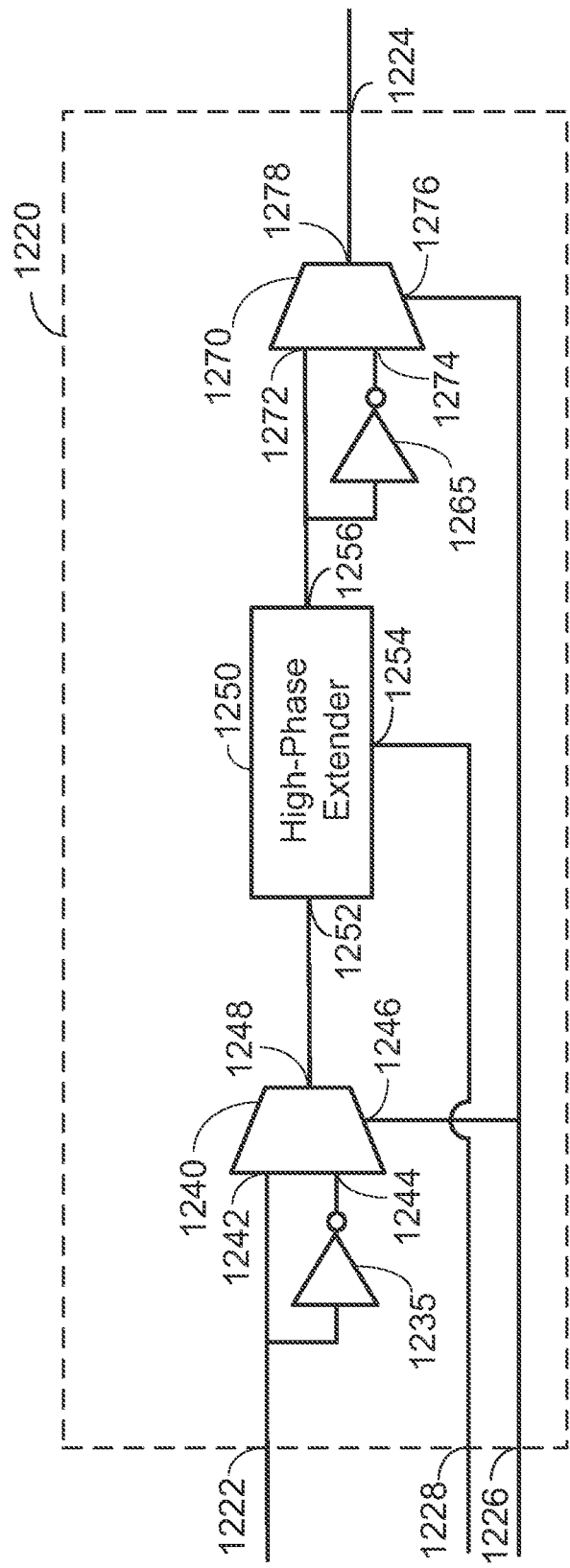
FIG. 12 shows an exemplary implementation of a duty-cycle adjuster according to certain aspects of the present disclosure.

FIG. 12 shows an exemplary implementation of a duty-cycle adjuster 1220 according to certain aspects. The duty-cycle adjuster 1220 may be used to implement the duty-cycle adjuster 320 in FIG. 3 (i.e., the duty-cycle adjuster 320 may be an instance of the duty-cycle adjuster 320). The duty-cycle adjuster 1220 has a signal input 1222, a first control input 1226, a second control input 1228, and an output 1224. For the example where the duty-cycle adjuster 1220 implements the duty-cycle adjuster 320 in FIG. 3, the signal input 1222 corresponds to the signal input 322, the output 1224 corresponds to the output 324, and the first control input 1226 and the second control input 1228 corresponds to the control input 326 (i.e., the control input 326 includes two inputs in this example).

In this example, the duty-cycle adjuster 1220 includes a first inverter 1235, a first multiplexer 1240, a high-phase extender 1250, a second inverter 1265, and a second multiplexer 1270. The first multiplexer 1240 has a first input 1242, a second input 1244, a select input 1246, and an output 1248. The first input 1242 of the first multiplexer 1240 is coupled to the signal input 1222 of the duty-cycle adjuster 1220, and the select input 1246 of the first multiplexer 1240 is coupled to the first control input 1226. The first inverter 1235 is coupled between the signal input 1222 of the duty-cycle adjuster 1220 and the second input 1244 of the first multiplexer 1240. As used herein, an "inverter" covers any circuit implementation that can perform the inverting function such as using a NAND gate, a complementary metal-oxide semiconductor (CMOS) inverter, or any logic gate or combination of logic gates that can perform the inverting function.

The high-phase extender 1250 has a signal input 1252, a control input 1254, and an output 1256. The signal input 1252 of the high-phase extender 1250 is coupled to the output 1248 of the first multiplexer 1240, and the control input 1254 of the high-phase extender 1250 is coupled to the second control input 1228 of the duty-cycle adjuster 1220. As discussed further below, the high-phase extender 1250 is configured to extend the high phase of a clock signal by an adjustable amount based on a phase control signal received at the control input 1254.

The second multiplexer 1270 has a first input 1272, a second input 1274, a select input 1276, and an output 1278. The first input 1272 of the second multiplexer 1270 is coupled to the output 1256 of the high-phase extender 1250, and the select input 1276 of the second multiplexer 1270 is coupled to the first control input 1226. The second inverter 1265 is coupled between the output 1256 of the high-phase extender 1250 and the second input 1274 of the second multiplexer 1270. The output 1278 of the second multiplexer 1270 is coupled to the output 1224.

The duty-cycle adjuster 1220 is configured to receive a clock signal at the signal input 1222 (e.g., from the clock generator 115), adjust the duty-cycle of the clock signal, and output the clock signal after duty-cycle adjustment at the output 1224. The duty-cycle adjuster 1220 is capable of increasing or decreasing the duty cycle of the clock signal. Thus, the duty-cycle adjuster 1220 supports duty-cycle adjustments in either direction.

To increase the duty cycle of the clock signal input to the duty-cycle adjuster 1220, the duty-cycle control circuit 330 (shown in FIG. 3) causes each of the first multiplexer 1240 and the second multiplexer 1270 to select the respective first input 1242 and 1272 via the first control input 1226. In this case, the first multiplexer 1240 passes the clock signal to the signal input 1252 of the high-phase extender 1250. The high-phase extender 1250 then extends the high phase of the clock signal by an adjustable amount based on a phase control signal received from the duty-cycle control circuit 330 via the second control input 1228. By extending the high phase of the clock signal, the high-phase extender 1250 increases the duty cycle of the clock signal. The larger the amount of high-phase extension by the high-phase extender 1250, the larger the increase in the duty-cycle of the clock signal. In this example, the second multiplexer 1270 passes the clock signal after the high-phase extension to the output 1224 of the duty-cycle adjuster 1220.

To decrease the duty cycle of the clock signal input to the duty-cycle adjuster 1220, the duty-cycle control circuit 330 (shown in FIG. 3) causes each of the first multiplexer 1240 and the second multiplexer 1270 to select the respective second input 1244 and 1274 via the first control input 1226. In this case, the first inverter 1235 inverts the clock signal and the first multiplexer 1240 passes the inverted clock signal to the signal input 1252 of the high-phase extender 1250. The high-phase extender 1250 then extends the high phase of the inverted clock signal by an adjustable amount based on a phase control signal received from the duty-cycle control circuit 330 via the second control input 1228. In this case, extending the high phase of the inverted clock signal is equivalent to extending the low phase of the clock signal, which decreases the duty cycle of the clock signal. The larger the amount by which the high-phase extender 1250 extends the high phase of the inverted clock signal, the larger the decrease in the duty-cycle of the clock signal. In this example, the second inverter 1265 inverts the inverted clock signal after high-phase extension to obtain the clock signal, and the second multiplexer 1270 passes the clock signal from the second inverter 1265 to the output 1224 of the duty-cycle adjuster 1220.

Thus, the duty-cycle adjuster 1220 is capable of increasing or decreasing the duty cycle of the clock signal. To increase the duty cycle of the clock signal, the high-phase extender 1250 extends the high phase of the clock signal. To decrease the duty cycle of the clock signal, the first inverter 1235 inverts the clock signal, the high-phase extender 1250 extends the high phase of the inverted clock signal (which is equivalent to extending the low phase of the clock signal), and the second inverter 1265 inverts the inverted clock signal back into the clock signal. For applications where only high-phase extension is used, the multiplexers 1240 and 1270, and the inverters 1235 and 1265 may be omitted.

Figure 13:
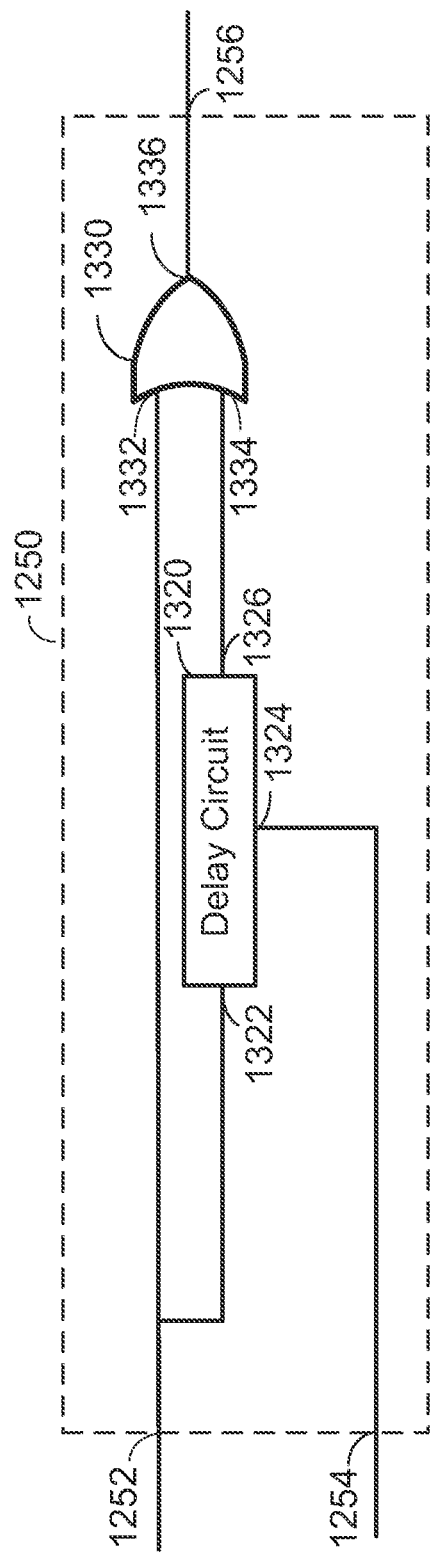
FIG. 13 shows an exemplary implementation of a high-phase extender according to certain aspects of the present disclosure.

FIG. 13 shows an exemplary implementation of the high-phase extender 1250 according to certain aspects. In this example, the high-phase extender 1250 includes an OR gate 1330, and a delay circuit 1320. It is to be appreciated that the OR gate 1330 may be implemented with a combination of two or more gates to generate the equivalent logic function. For example, in some implementations, the OR gate 1330 may include a NOR gate and an inverter.

The OR gate 1330 has a first input 1332, a second input 1334, and an output 1336. The first input 1332 is coupled to the signal input 1252 of the high-phase extender 1250, and the output 1336 is coupled to the output 1256 of the high-phase extender 1250. The delay circuit 1320 has a signal input 1322, a control input 1324, and an output 1326. The signal input 1322 of the delay circuit 1320 is coupled to the signal input 1252 of the high-phase extender 1250, the control input 1324 of the delay circuit 1320 is coupled to the control input 1254 of the high-phase extender 1250, and the output 1326 of the delay circuit 1320 is coupled to the second input 1334 of the OR gate 1330.

The delay circuit 1320 is configured to delay the clock signal by an adjustable time delay based on a delay control signal received via the control input 1254. The resulting delayed clock signal is input to the second input 1334 of the OR gate 1330. The OR gate 1330 performs an OR function on the clock signal at the first input 1332 and the delayed clock signal at the second input 1334 to generate the clock signal at the output 1336. The clock signal at the output 1336 has an extended high-phase compared with the clock signal at the signal input 1252 in which the high-phase extension is controlled by the time delay of the delay circuit 1320. The greater the time delay of the delay circuit 1320, the greater the high-phase extension of the clock signal at the output 1336. Thus, in this example, the duty-cycle control circuit 330 (shown in FIG. 3) controls the high-phase extension of the clock signal at the output 1256 of the high-phase extender 1250 by controlling the time delay of the delay circuit 1320. In this example, the phase control signal discussed above corresponds to the delay control signal input to the control input 1324 of the delay circuit 1320.

Figure 14A:
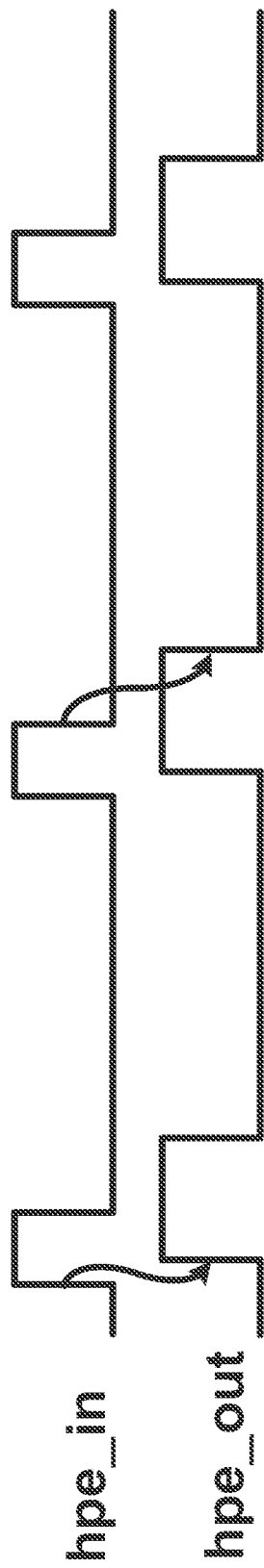
FIG. 14A is a timing diagram showing an example of high-phase extension according to certain aspects of the present disclosure.
Figure 14B:
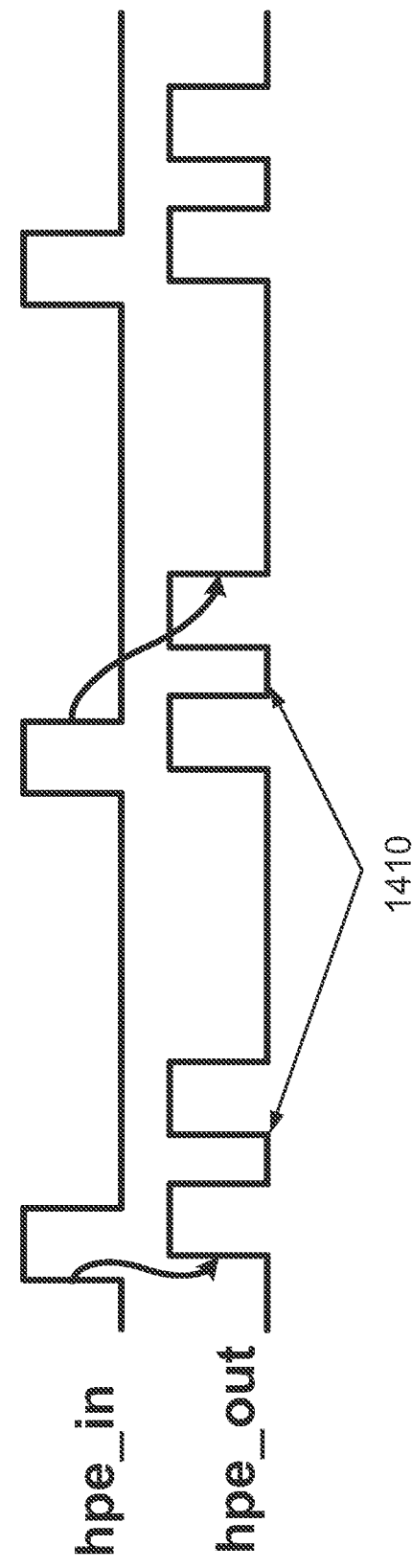
FIG. 14B is a timing diagram showing an example of high-phase extension resulting in a glitch according to certain aspects of the present disclosure.

In this example, the time delay of the delay circuit 1320 may be limited by the high phase of the clock signal at the signal input 1252 (i.e., time delay of the delay circuit 1320≤input high phase). This is because increasing the time delay beyond the input high phase can result in a clock glitch. In this regard, FIG. 14A shows an example of the clock signal at the signal input 1252 (labeled "hpe_in") and the clock signal at the output 1256 (labeled "hpe_out") for a case where the time delay is less than the high phase of the clock signal at the signal input 1252, and FIG. 14B shows an example of the clock signal at the signal input 1252 (labeled "hpe_in") and the clock signal at the output 1256 (labeled "hpe_out") for a case where the time delay is greater than the high phase of the clock signal at the signal input 1252. As shown in FIG. 14B, making the time delay of the delay circuit 1320 greater than the high phase of the clock signal at the signal input 1252 may result in clock glitches 1410.

Thus, the exemplary implementation of the high-phase extender 1250 may be limited to extending the high phase of the output clock signal by an amount equal to or less than the high phase of the input clock signal (i.e., time delay of the delay circuit 1320≤input high phase) for a maximum output high phase equal to twice the input high phase, and therefore may not be suitable use cases requiring a larger high-phase extension.

Figure 15A:
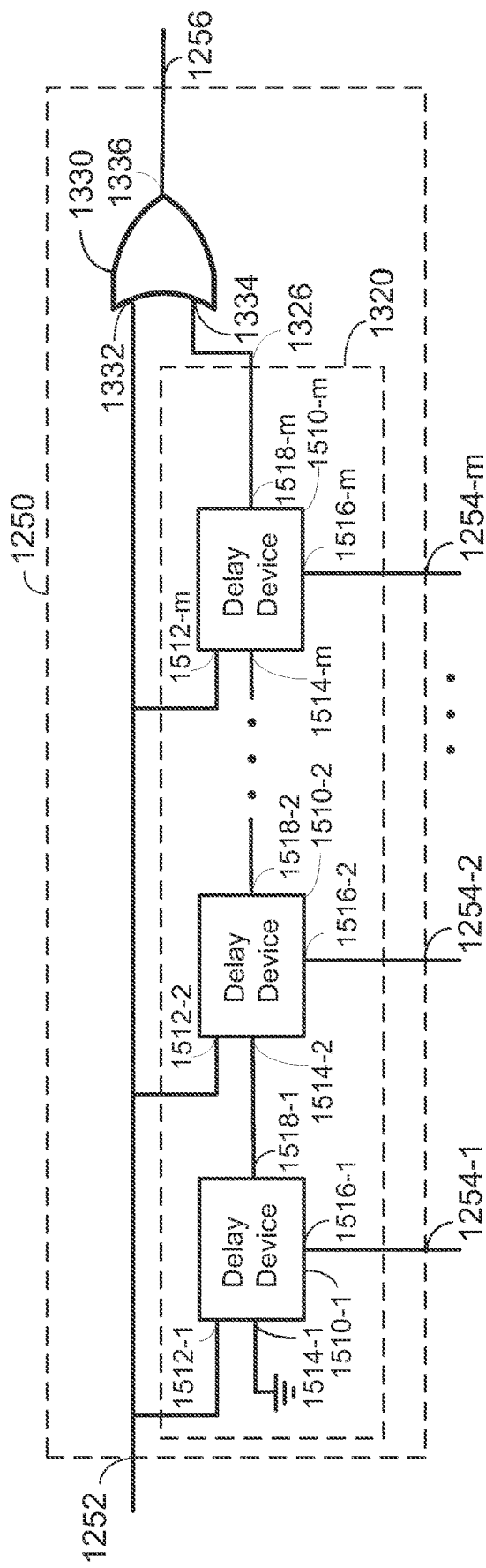
FIG. 15A shows another exemplary implementation of a high-phase extender according to certain aspects of the present disclosure.

To address this, FIG. 15A shows an exemplary implementation of the delay circuit 1320 that provides a larger high-phase extension range according to certain aspects. In this example, the delay circuit 1320 includes multiple delay devices 1510-1 to 1510-m coupled in series to form a delay line. The delay devices 1510-1 to 1510-m may also be referred to as delay segments, or another term. Each of the delay devices 1510-1 to 1510-m has a respective first signal input 1512-1 to 1512-m, a respective second signal input 1514-1 to 1514-m, a respective control input 1516-1 to 1516-m, and a respective delay output 1518-1 to 1518-m. The first signal input 1512-1 of the delay device 1510-1 is coupled to the signal input 1252 of the high-phase extender 1250. In the example in FIG. 15A, the second signal input 1514-1 of the delay device 1510-1 is coupled to ground. The delay output 1518-1 to 1518-(m−1) of each of delay devices 1510-1 to 1510-(m−1) is coupled to the second signal input 1514-2 to 1514-m of the next delay device 1510-2 to 1510-m in the delay line, and the delay output 1518-m of delay device 1510-m is coupled to the second input 1334 of the OR gate 1330, as shown in FIG. 15A. The first signal input 1512-2 to 1512-m of each of the delay devices 1510-2 to 1510-m is coupled to the signal input 1252 of the high-phase extender 1250.

Each of the delay devices 1510-1 to 1510-m is configured to receive a respective control signal (e.g., control bit) via the respective control input 1516-1 to 1516-m. In this example, the control input 1254 of the high-phase extender 1250 includes multiple control inputs 1254-1 to 1254-m in which each of the multiple control inputs 1254-1 to 1254-m is coupled to the control input 1516-1 to 1516-m of a respective one of the delay devices 1510-1 to 1510-m.

In this example, each of the delay devices 1510-1 to 1510-m is configured to enable or disable the respective delay output 1518-1 to 1518-m based on the respective control signal. For example, each of the delay devices 1510-1 to 1510-m may be configured to enable the respective delay output 1518-1 to 1518-m when the respective control signal has a first logic value and to disable the respective delay output 1518-1 to 1518-m when the respective control signal has a second logic value. The first logic value may be one and the second logic value may be zero, or vice versa.

Each of the delay devices 1510-1 to 1510-m is configured to pass a high phase (i.e., logic one) at the respective first signal input 1512-1 to 1512-m to the respective delay output 1518-1 to 1518-m and pass a high phase (i.e., logic one) at the respective second signal input 1514-1 to 1514-m to the respective delay output 1518-1 to 1518-m when the respective delay output 1518-1 to 1518-m is enabled. In the example in FIG. 15A, the second signal input 1514-1 of delay device 1510-1 is coupled to ground. Each of the delay devices 1510-1 to 1510-m is configured to block the signal (i.e., clock signal) at the respective first signal input 1512-1 to 1512-m and block (i.e., gate) the signal (i.e., clock signal) at the respective second signal input 1514-1 to 1514-m when the respective delay output 1518-1 to 1518-m is disabled. In this example, each of the delay devices 1510-1 to 1510-m may output a static logic value at the respective delay output 1518-1 to 1518-m when the respective delay output 1518-1 to 1518-m is disabled. The static logic value may be a zero or a one.

In this example, the duty-cycle control circuit 330 (shown in FIG. 3) controls the high-phase extension of the high-phase extender 1250 by controlling the number of the delay devices 1510-1 to 1510-m with enabled delay outputs 1518-1 to 1518-m via the control inputs 1254-1 to 1254-m. The larger the number of the delay devices 1510-1 to 1510-m with enabled delay outputs 1518-1 to 1518-m, the larger the high-phase extension of the clock signal at the output 1256. In this example, the duty-cycle control circuit 330 enables the delay outputs 1518-1 to 1518-m of the delay devices 1510-1 to 1510-m (also referred to as delay segments) from right to left in FIG. 15A starting with the delay output 1518-m of delay device 1510-m. Thus, to enable the delay output of one of the delay devices 1510-1 to 1510-m, the duty-cycle control circuit 330 enables the delay output 1518-m of delay device 1510-m. To enable the delay outputs of two of the delay devices 1510-1 to 1510-m, the duty-cycle control circuit 330 enables the delay outputs 1518-m and 1518-(m−1) of delay devices 1510-m and 1510-(m−1). To enable the delay outputs of three of the delay devices 1510-1 to 1510-m, the duty-cycle control circuit 330 enables the delay outputs 1518-m, 1518-(m−1), and 1518-(m−2) of delay devices 1510-m, 1510-(m−1), and 1510-(m−2), and so forth. Note that delay devices 1510-(m−1) and 1510-(m−2) are not explicitly shown in FIG. 15A for ease of illustration.

In this example, the delay devices 1510-1 to 1510-m increase the high-phase extension range of the high-phase extender 1250. This is because the delay devices with enabled delay outputs generate multiple delayed versions of the clock signal delayed by different time delays. The high phases of the multiple delayed versions of the clock signal are combined at the output 1326 of the delay circuit 1320 and ORed with the clock signal at the OR gate 1330. This allows the high-phase extender 1250 to achieve a large high-phase extension range for the output clock signal, as discussed further below.

Figure 15B:
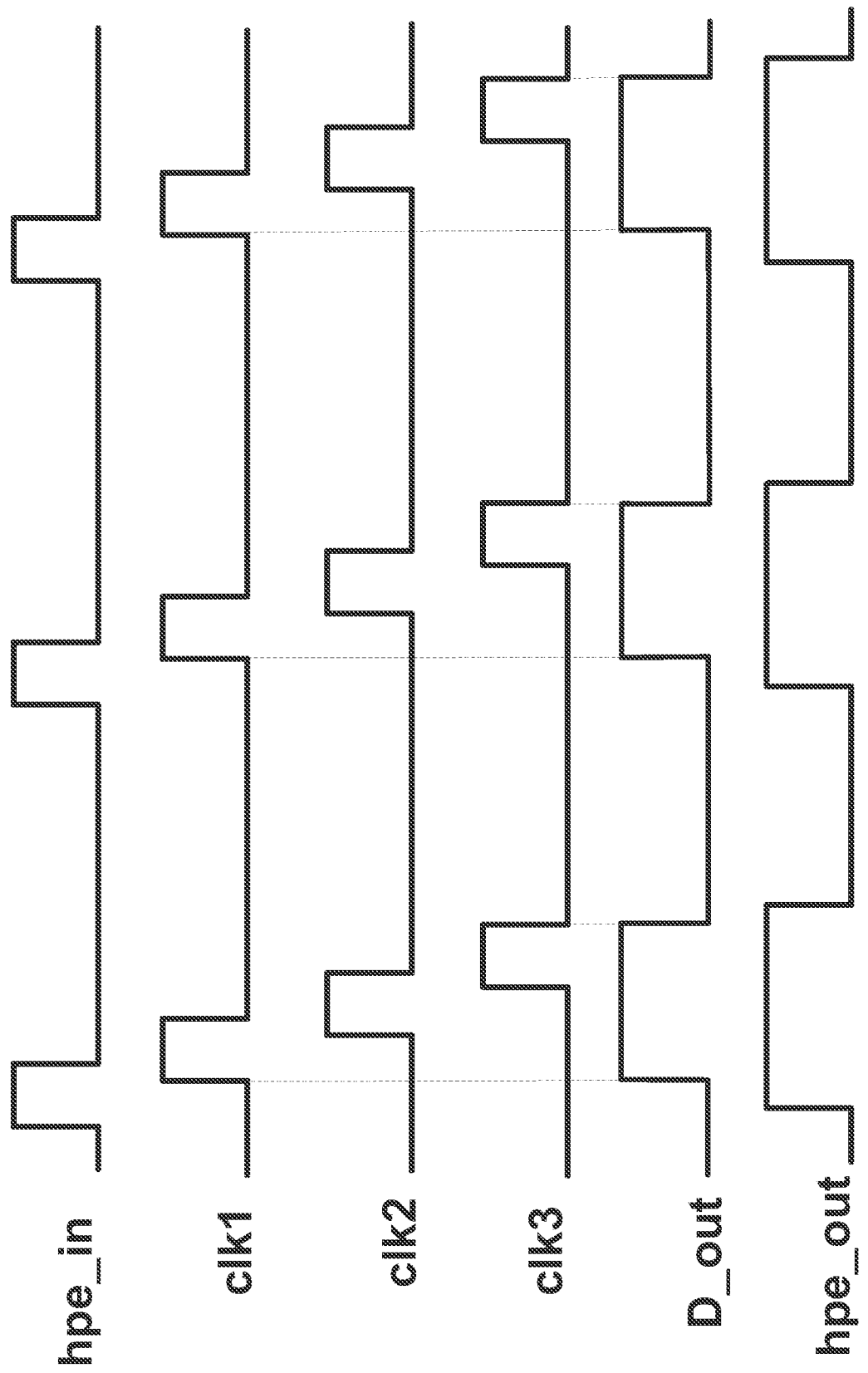
FIG. 15B is a timing diagram showing an example of multiple delayed versions of a clock signal generated in the high-phase extender according to certain aspects of the present disclosure.

An example of the multiple delayed versions of the clock signal is illustrated in FIG. 15B for an example in which the delay outputs 1518-m, 1518-(m−1), and 1518-(m−2) of three of the delay devices 1510-m, 1510-(m−1), and 1510-(m−2) are enabled. FIG. 15B shows the clock signal at the signal input 1252 (labeled "hpe_in") of the high-phase extender 1250 and the clock signal at the output 1256 (labeled "hpe_out) of the high-phase extender 1250. FIG. 15B also conceptual shows a first delayed version of the clock signal (labeled "clk1"), a second delayed version of the clock signal (labeled "clk2"), and a third delayed version of the clock signal (labeled "clk3") in this example. The delayed versions of the clock signal clk1, clk2, and clk3 are shown separately at the output 1326 of the delay circuit 1320 in FIG. 15B for ease of illustration. In actuality, the high phases of the delayed versions of the clock signal clk1, clk2, and clk3 are combined (i.e., merged) at the output 1326 of the delay circuit 1320, forming the delay output signal (labeled "D_out") shown in FIG. 15B.

In this example, the first delayed version of the clock signal clk1 is generated from the clock signal entering the first signal input 1512-m of delay device 1510-m and is delayed by the time delay of delay device 1510-m to reach the output 1326. The second delayed version of the clock signal clk2 is generated from the clock signal entering the first signal input 1512-(m−1) of delay device 1510-(m−1) and is delayed by the time delays of the delay devices 1510-(m−1) and 1510-m to reach the output 1326. The third delayed version of the clock signal clk3 is generated from the clock signal entering the first signal input 1512-($m$−2) of delay device 1510-($m$−2) and is delayed by the time delays of delay devices 1510-($m$−2), 1510-($m$−1), and 1510-$m$ to reach the output 1326. Note that the high phases of the multiple delayed versions of the clock signal clk1, clk2, and clk3 overlap in time.

In this example, the delay output signal D_out at the output 1326 of the delay circuit 1320 is ORed with the clock signal at the signal input 1252 (labeled "hpe_in") by the OR gate 1330 to produce a clock signal at the output 1256 (labeled "hpe_out") with a large high-phase extension. In this example, clock glitch is prevented by making the individual time delay of each of the delay devices 1510-1 to 1510-$m$ less than the high phase of the input clock signal so that the delayed versions of the clock signal overlap in time. However, since the delay circuit 1320 includes multiple delay devices 1510-1 to 1510-$m$, the high-phase extender 1250 is able to achieve a high-phase extension greater than the high phase of the input clock signal without a glitch.

Figure 16:
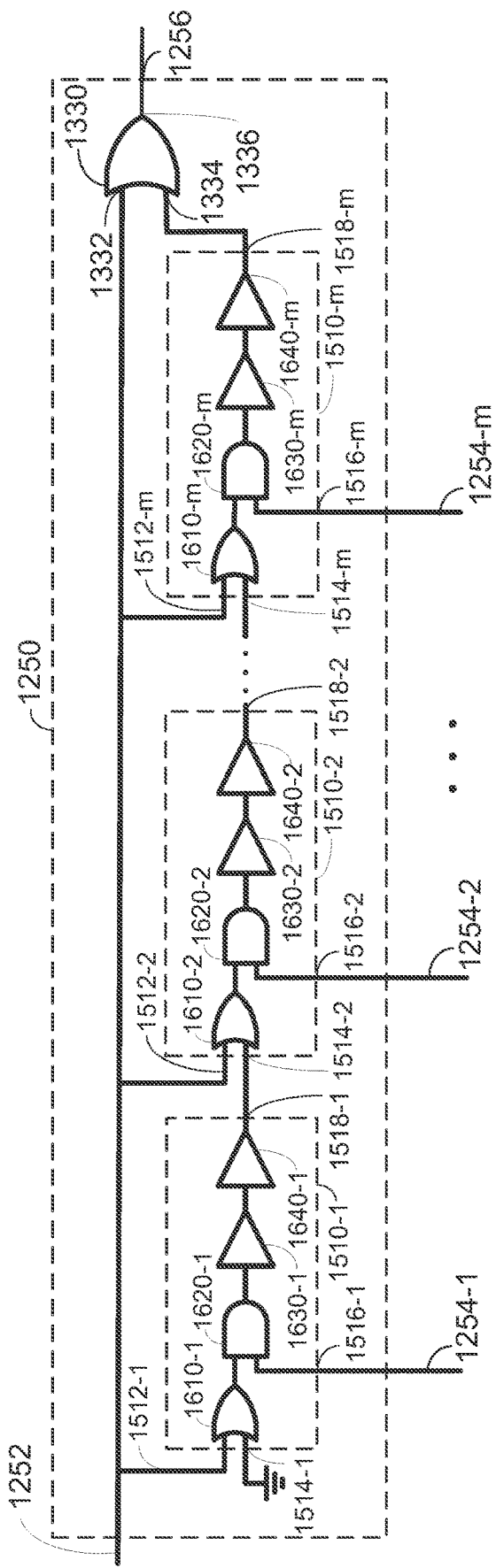
FIG. 16 shows still another exemplary implementation of a high-phase extender according to certain aspects of the present disclosure.

FIG. 16 shows an exemplary implementation of each of the delay devices 1510-1 to 1510-$m$ according to certain aspects. In this example, each of the delay devices 1510-1 to 1510-$m$ includes a respective OR gate 1610-1 to 1610-$m$, a respective AND gate 1620-1 to 1620-$m$, and respective delay buffers 1630-1 to 1630-$m$ and 1640-1 to 1640-$m$. In each of the delay devices 1510-1 to 1510-$m$, the respective OR gate 1610-1 to 1610-$m$ has a first input coupled to the respective first signal input 1512-1 to 1512-$m$ and a second input coupled to the respective second signal input 1514-1 to 1514-$m$. In each of the delay devices 1510-1 to 1510-$m$, the respective AND gate 1620-1 to 1620-$m$ has a first input coupled to the output of the respective OR gate 1610-1 to 1610-$m$ and a second input coupled to the respective control input 1516-1 to 1516-$m$. In each of the delay devices 1510-1 to 1510-$m$, the respective delay buffers 1630-1 to 1630-$m$ and 1640-1 to 1640-$m$ are coupled in series between the output of the respective AND gate 1620-1 to 1620-$m$ and the respective delay output 1518-1 to 1518-$m$.

In this example, in each of the delay devices 1510-1 to 1510-$m$, the respective OR gate 1610-1 to 1610-$m$ passes a high phase at the respective first signal input 1512-1 to 1512-$m$ and a high phase at the respective second signal input 1514-1 to 1514-$m$ to the output of the respective OR gate 1610-1 to 1610-$m$. In each of the delay devices 1510-1 to 1510-$m$, the respective AND gate 1620-1 to 1620-$m$ enables the respective delay output when the respective control signal is one (i.e., the AND gate passes a high phase to the respective delay output) and disables the respective delay output when the respective control signal is zero (i.e., the AND gate blocks a high phase and outputs a zero).

It is to be appreciated that each of the delay devices 1510-1 to 1510-$m$ may include a different number of delay buffers than the number of delay buffers shown in the example in FIG. 16 depending on, for example, a desired delay for each of the delay devices 1510-1 to 1510-$m$. In some implementations, the delay buffers 1630-1 to 1630-$m$ and the 1640-1 to 1640-$m$ may be omitted all together, for example, when the delays of the OR gates 1610-1 to 1610-$m$ and the delays of the AND gates 1620-1 to 1620-$m$ already provide the desired delay for each of the delay devices 1510-1 to 1510-$m$.

In the exemplary implementations of the high-phase extender 1250 illustrated in FIG. 15A and FIG. 16, only the time delay of an individual delay device (i.e., 1510-$m$, 1510-($m$−1), . . . 1510-1) needs to be less than or equal to the high phase of the input clock signal to avoid clock glitches while the high phase of the output clock may be extended by the accumulation of the time delays from the enabled delay devices. The exemplary implementations of the high-phase extender 1250 in FIG. 15A and FIG. 16 allow an extension of the high phase of the output clock signal greater than the high phase of the input clock signal, thus enabling a larger range of high-phase extension while avoiding clock glitches.

Figure 17:
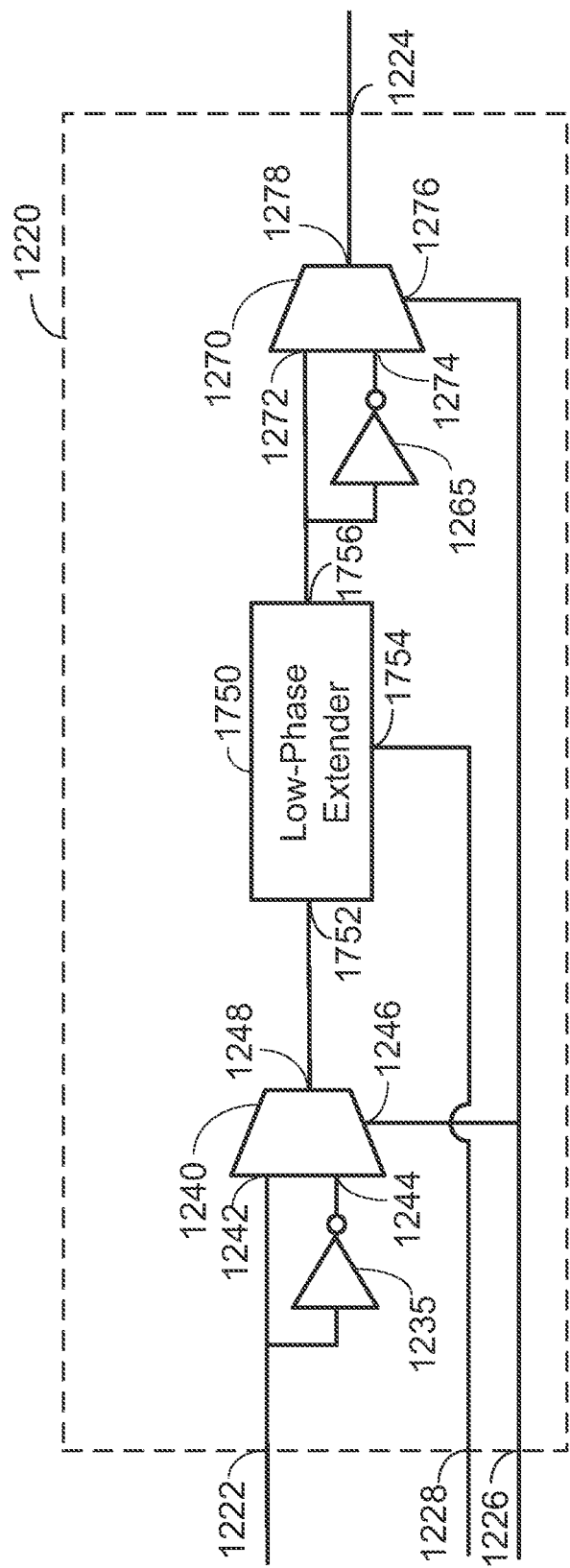
FIG. 17 shows another exemplary implementation of a duty-cycle adjuster according to certain aspects.

It is to be appreciated that the duty-cycle adjuster 1220 is not limited to the high-phase extender 1250. In this regard, FIG. 17 shows an example in which the duty-cycle adjuster 1220 includes a low-phase extender 1750 instead of the high-phase extender 1250. In this example, the low-phase extender has a signal input 1752 coupled to the output 1248 of the first multiplexer 1240, a control input 1754 coupled to the second control input 1228, and an output 1756 the first input 1272 of the second multiplexer 1270. In this example, the low-phase extender 1750 is configured to extend the low phase of the clock signal by an adjustable amount based on the phase control signal received via the control input 1754.

To decrease the duty cycle of the clock signal input to the duty-cycle adjuster 1220, the duty-cycle control circuit 330 (shown in FIG. 3) causes each of the first multiplexer 1240 and the second multiplexer 1270 to select the respective first input 1242 and 1272 via the first control input 1226. In this case, the first multiplexer 1240 passes the clock signal to the signal input 1752 of the low-phase extender 1750. The low-phase extender 1750 then extends the low phase of the clock signal by an adjustable amount based on a phase control signal received from the duty-cycle control circuit 330 via the second control input 1228. By extending the low phase of the clock signal, the low-phase extender 1750 decreases the duty cycle of the clock signal.

To increase the duty cycle of the clock signal input to the duty-cycle adjuster 1220, the duty-cycle control circuit 330 (shown in FIG. 3) causes each of the first multiplexer 1240 and the second multiplexer 1270 to select the respective second input 1244 and 1274 via the first control input 1226. In this case, the first inverter 1235 inverts the clock signal and the first multiplexer 1240 passes the inverted clock signal to the low-phase extender 1750. The low-phase extender 1750 then extends the low phase of the inverted clock signal by an adjustable amount based on a phase control signal received from the duty-cycle control circuit 330 via the second control input 1228. In this case, extending the low phase of the inverted clock signal is equivalent to extending the high phase of the clock signal, which increases the duty cycle of the clock signal. In this example, the second inverter 1265 inverts the inverted clock signal after low-phase extension to obtain the clock signal, and the second multiplexer 1270 passes the clock signal from the second inverter 1265 to the output 1224 of the duty-cycle adjuster 1220.

In general, the duty-cycle adjuster 1220 includes a high-phase extender (e.g., high-phase extender 1250) or a low-phase extender (e.g., low-phase extender 1750) between the output 1248 of the first multiplexer 1240 and the first input 1272 of the second multiplexer 1270, in which the high-phase extender extends the high phase of the clock signal or the low-phase extender extends the low phase of the clock signal by an adjustable amount based on the phase control signal received via the second control input 1228.

Figure 18:
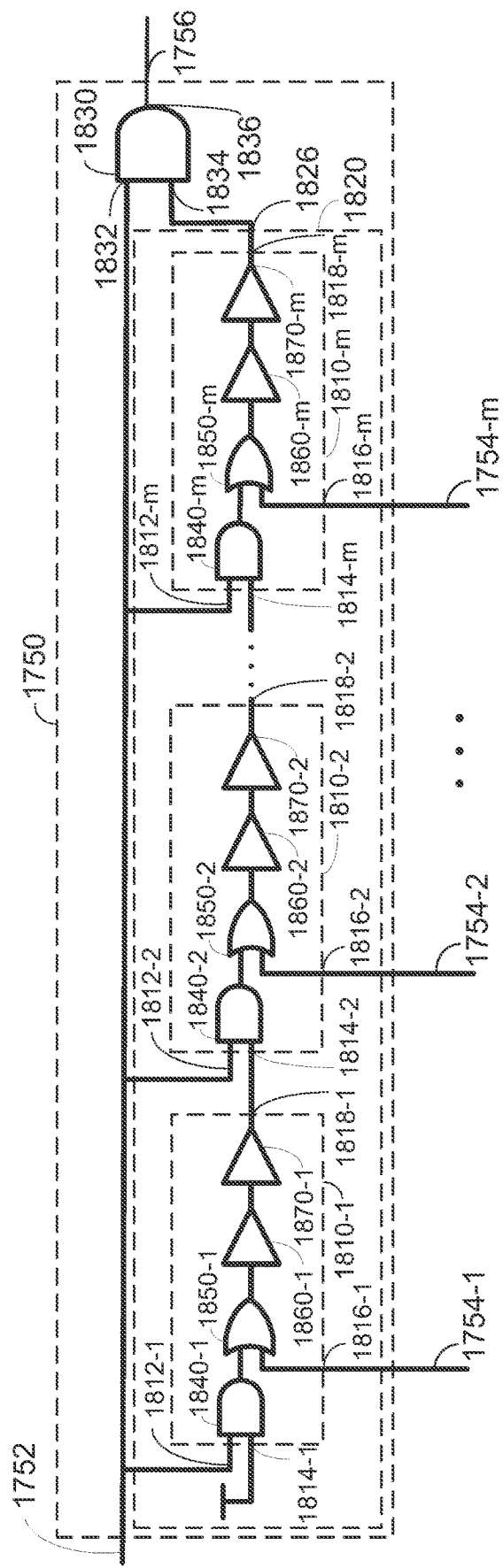
FIG. 18 shows an exemplary implementation of a low-phase extender according to certain aspects of the present disclosure.

FIG. 18 shows an exemplary implementation of the low-phase extender 1750 according to certain aspects. In this example, the low-phase extender 1750 includes an AND gate 1830 and a delay circuit 1820. The AND gate 1830 has a first input 1832, a second input 1834, and an output 1836. The first input 1832 of the AND gate 1830 is coupled to the signal input 1752 of the low-phase extender 1750, the delay circuit 1820 is coupled between the signal input 1752 of the low-phase extender 1750 and the second input 1834 of the AND gate 1830, and the output 1836 of the AND gate 1830 is coupled to the output 1756 of the low-phase extender 1750. It is to be appreciated that an AND gate may be implemented with a combination of a NAND gate and an inverter, or any other combination of logic gates that can perform an AND operation.

In this example, the delay circuit 1820 includes multiple delay devices 1810-1 to 1810-*m* coupled in series to form a delay line. Each of the delay devices 1810-1 to 1810-*m* has a respective first signal input 1812-1 to 1812-*m*, a respective second signal input 1814-1 to 1814-*m*, a respective control input 1816-1 to 1816-*m*, and a respective delay output 1818-1 to 1818-*m*. The first signal input 1812-1 of the delay device 1810-1 is coupled to the signal input 1752 of the low-phase extender 1750 and the second signal input 1814-1 of the delay device 1810-1 is coupled to a supply rail (i.e., one). The delay output 1818-1 to 1818-(*m*−1) of each of delay devices 1810-1 to 1810-(*m*−1) is coupled to the second signal input 1814-2 to 1814-*m* of the next delay device 1810-2 to 1810-*m* in the delay line, and the delay output 1818-*m* of delay device 1810-*m* is coupled to the output 1826 of the delay circuit 1820, which is coupled to the second input 1834 of the AND gate 1830. The first signal input 1812-2 to 1812-*m* of each of the delay devices 1810-2 to 1810-*m* is coupled to the signal input 1752 of the low-phase extender 1750.

Each of the delay devices 1810-1 to 1810-*m* is configured to receive a respective control signal (e.g., control bit) via the respective control input 1816-1 to 1816-*m*. In this example, the control input 1754 of the low-phase extender 1750 includes multiple control inputs 1754-1 to 1754-*m* in which each of the multiple control inputs 1754-1 to 1754-*m* is coupled to the control input 1816-1 to 1816-*m* of a respective one of the delay devices 1810-1 to 1810-*m*.

In this example, each of the delay devices 1810-1 to 1810-*m* is configured to enable or disable the respective delay output 1818-1 to 1818-*m* based on the respective control signal. For example, each of the delay device 1810-1 to 1810-*m* may be configured to enable the respective delay output 1818-1 to 1818-*m* when the respective control signal has a first logic value and to disable the respective delay output 1818-1 to 1818-*m* when the respective control signal has a second logic value. The first logic value may be zero and the second logic value may be one, or vice versa.

Each of the delay devices 1810-1 to 1810-*m* is configured to pass a low phase (i.e., logic zero) at the respective first signal input 1812-1 to 1812-*m* to the respective delay output 1818-1 to 1818-*m* and pass a low phase (i.e., logic zero) at the respective second signal input 1814-1 to 1814-*m* to the respective delay output 1818-1 to 1818-*m* when the respective delay output 1818-1 to 1818-*m* is enabled. In the example in FIG. 18, the second signal input 1814-1 of delay device 1810-1 is coupled to the supply rail. Each of the delay devices 1810-1 to 1810-*m* is configured to block the signal (i.e., clock signal) at the respective first signal input 1812-1 to 1812-*m* and block (i.e., gate) the signal (i.e., clock signal) at the respective second signal input 1814-2 to 1814-*m* when the respective delay output 1818-1 to 1818-*m* is disabled. In this example, each of the delay devices 1810-1 to 1810-*m* may output a static logic value at the respective delay output 1818-1 to 1818-*m* when the respective delay output 1818-1 to 1818-*m* is disabled. The static logic value may be a one or a zero.

In this example, the duty-cycle control circuit 330 (shown in FIG. 3) controls the low-phase extension of the low-phase extender 1750 by controlling the number of the delay devices 1810-1 to 1810-*m* with enabled delay outputs 1818-1 to 1818-*m* via the control inputs 1754-1 to 1754-*m*. The larger the number of the delay devices 1810-1 to 1810-*m* with enabled delay outputs 1818-1 to 1818-*m*, the larger the low-phase extension of the clock signal at the output 1756. In this example, the duty-cycle control circuit 330 enables the delay outputs 1818-1 to 1818-*m* of the delay devices 1810-1 to 1810-*m* (also referred to as delay segments) from right to left in FIG. 18 starting with the delay output 1818-*m* of delay device 1810-*m*. The delay devices 1810-1 to 1810-*m* with enabled delay outputs 1818-1 to 1818-*m* generated multiple versions of the clock signal in which the low phases of the multiple versions of the clock signal are combined at the output 1826 of the delay circuit 1820 to provide a delay output signal with an extended low phase. The larger the number of the delay devices 1810-1 to 1810-*m* with enabled delay outputs 1818-1 to 1818-*m*, the larger the low-phase extension. The delay output signal is ANDed with the clock signal at the signal input 1752 by the AND gate 1830 to provide the clock signal at the output 1756.

FIG. 18 shows an exemplary implementation of each of the delay devices 1810-1 to 1810-*m* according to certain aspects. In this example, each of the delay devices 1810-1 to 1810-*m* includes a respective AND gate 1840-1 to 1840-*m*, a respective OR gate 1850-1 to 1850-*m*, and respective delay buffers 1860-1 to 1860-*m* and 1870-1 to 1870-*m*. In each of the delay devices 1810-1 to 1810-*m*, the respective AND gate 1840-1 to 1840-*m* has a first input coupled to the respective first signal input 1812-1 to 1812-*m* and a second input coupled to the respective second signal input 1814-1 to 1814-*m*. In each of the delay devices 1810-1 to 1810-*m*, the respective OR gate 1850-1 to 1850-*m* has a first input coupled to the output of the respective AND gate 1840-1 to 1840-*m* and a second input coupled to the respective control input 1816-1 to 1816-*m*. In each of the delay devices 1810-1 to 1810-*m*, the respective delay buffers 1860-1 to 1860-*m* and 1870-1 to 1870-*m* are coupled in series between the output of the respective OR gate 1850-1 to 1850-*m* and the respective delay output 1818-1 to 1818-*m*.

In this example, in each of the delay devices 1810-1 to 1810-*m*, the respective AND gate 1840-1 to 1840-*m* passes a low phase at the respective first signal input 1812-1 to 1812-*m* and a low phase at the respective second signal input 1814-1 to 1814-*m* to the output of the respective AND gate 1840-1 to 1840-*m*. In each of the delay devices 1810-1 to 1810-*m*, the respective OR gate 1850-1 to 1850-*m* enables the respective delay output when the respective control signal is zero (i.e., the OR gate passes a low phase to the respective delay output) and disables the respective delay output when the respective control signal is one (i.e., the OR gate blocks a low phase and outputs a one).

It is to be appreciated that each of the delay devices 1810-1 to 1810-*m* may include a different number of delay buffers than the number of delay buffers shown in the example in FIG. 18 depending on, for example, a desired delay for each of the delay devices 1810-1 to 1810-*m*.

Figure 19:
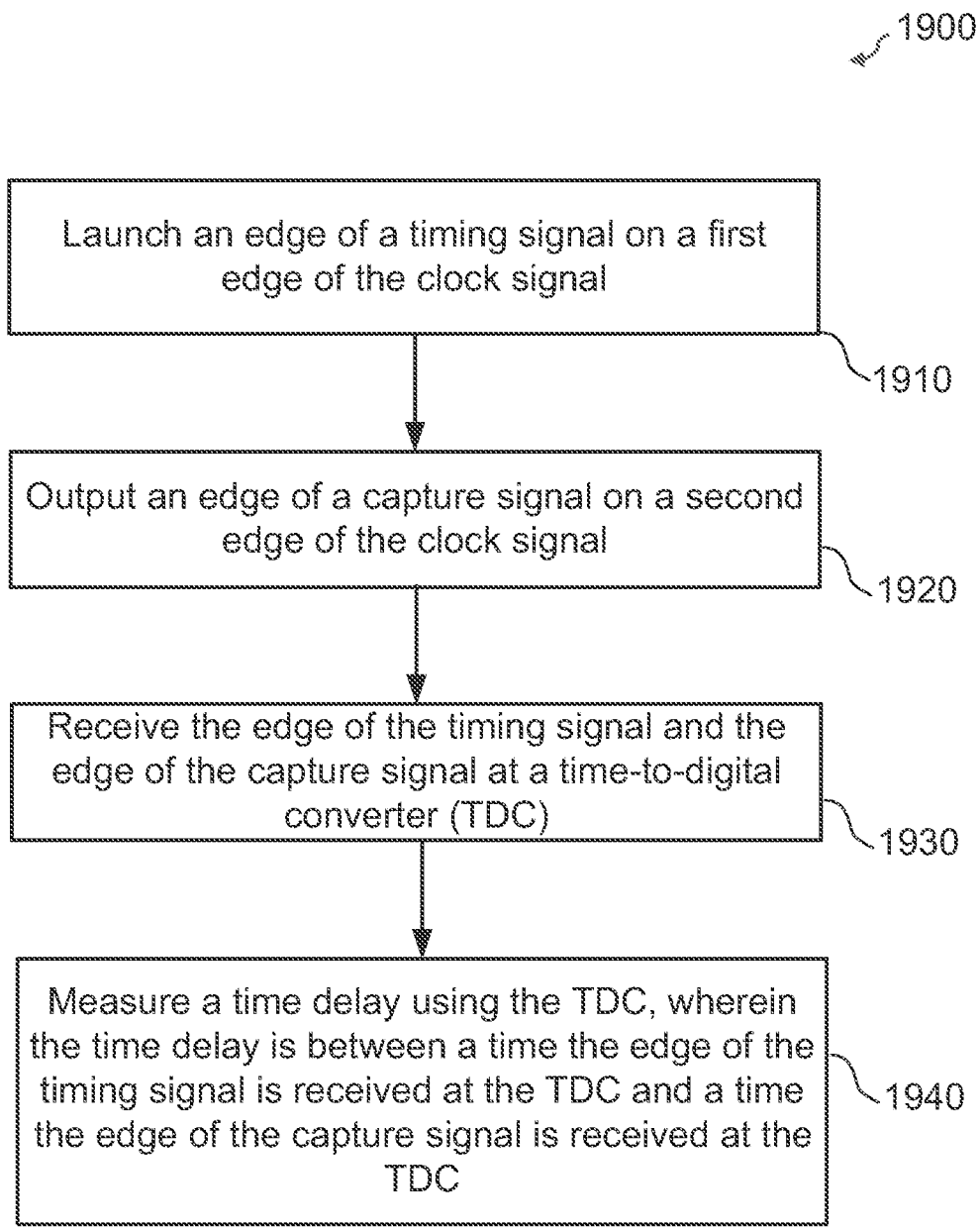
FIG. 19 is a flowchart illustrating a method of measuring a clock signal according to certain aspects of the present disclosure.

FIG. 19 illustrates a method 1900 of measuring a clock signal. The method 1900 may be performed by the timing measurement circuit 510 according to certain aspects.

At block 1910, an edge of a timing signal is launched on a first edge of the clock signal. For example, the edge of the timing signal may be launched by the launch circuit 530. The first edge of the clock signal may be a rising edge or a falling edge of the clock signal.

At block 1920, an edge of a capture signal is output on a second edge of the clock signal. For example, the edge of the capture signal may be output by the capture circuit 540. The second edge of the clock signal may be a rising edge or a falling edge of the clock signal.

At block 1930, the edge of the timing signal and the edge of the capture signal are received at a time-to-digital converter (TDC). The TDC may correspond to the TDC 560.

At block 1940, a time delay is measured using the TDC, wherein the time delay is between a time the edge of the timing signal is received at the TDC and a time the edge of the capture signal is received at the TDC.

Implementation examples are described in the following numbered clauses:

1. A timing measurement circuit, comprising:
   a launch circuit having an enable input, a clock input, and an output, wherein the launch circuit is configured to receive an enable signal at the enable input, receive a clock signal at the clock input of the launch circuit, and, in response to receiving the enable signal, launch an edge of a timing signal at the output of the launch circuit on a first edge of the clock signal;
   a capture circuit having a clock input and an output, wherein the capture circuit is configured to receive the clock signal at the clock input of the capture circuit, and output an edge of a capture signal at the output of the capture circuit on a second edge of the clock signal; and
   a time-to-digital converter (TDC) having a signal input, a capture input, and an output, wherein the signal input of the TDC is coupled to the output of the launch circuit, and the capture input of the TDC is coupled to the output of the capture circuit.

2. The timing measurement circuit of clause 1, wherein the TDC is configured to:
   receive the edge of the timing signal at the signal input of the TDC;
   receive the edge of the capture signal at the capture input of the TDC;
   measure a time delay between a time that the edge of the timing signal is received and a time that the edge of the capture signal is received; and
   output a signal indicating the measured time delay at the output of the TDC.

3. The timing measurement circuit of clause 1 or 2, further comprising a delay circuit having a signal input and an output, wherein the signal input of the delay circuit is coupled to the output of the launch circuit, and the output of the delay circuit is coupled to the signal input of the TDC.

4. The timing measurement circuit of clause 3, wherein the delay circuit has an adjustable time delay, and the delay circuit is configured to:
   receive a delay control signal at a control input of the delay circuit; and
   set the time delay of the delay circuit based on the received delay control signal.

5. The timing measurement circuit of clause 4, wherein the TDC comprises:
   a flip-flop having a signal input, a clock input, and an output, wherein the signal input of the flip-flop is coupled to the signal input of the TDC, the clock input of the flip-flop is coupled to the capture input of the TDC, and the output of the flip-flop is coupled to the output of the TDC.

6. The timing measurement circuit of any one of clauses 1 to 4, wherein the TDC comprises:
   a delay line coupled to the signal input of the TDC, the delay line comprising delay buffers coupled in series; and
   flip-flops, each of the flip-flops having a respective signal input, a respective clock input, and a respective output, wherein the signal input of each of the flip-flops is coupled to an output of a respective one of the delay buffers, and the clock input of each of the flip-flops is coupled to the capture input of the TDC.

7. The timing measurement circuit of any one of clauses 1 to 6, wherein the launch circuit has a control input configured to receive an edge select signal, and wherein the launch circuit is configured to:
   select a rising edge of the clock signal for the first edge of the clock signal if the edge select signal has a first logic value; and
   select a falling edge of the clock signal for the first edge of the clock signal if the edge select signal has a second logic value.

8. The timing measurement circuit of clause 7, wherein the launch circuit comprises:
   a multiplexer having a first input, a second input, a select input, and an output, wherein the first input is coupled to the clock input of the launch circuit, and the select input is coupled to the control input of the launch circuit;
   an inverter coupled between the clock input of the launch circuit and the second input of the multiplexer; and
   a launch flip-flop having a signal input, a clock input, and an output, wherein the signal input of the launch flip-flop is coupled to the enable input of the launch circuit, the clock input of the launch flip-flop is coupled to the output of the multiplexer, and the output of the launch flip-flop is coupled to the output of the launch circuit.

9. The timing measurement circuit of clause 8, wherein the launch circuit further comprises:
   a first flip-flop having a signal input, a clock input, and an output, wherein the signal input of the first flip-flop is coupled to the enable input of the launch circuit, and the clock input of the first flip-flop is coupled to the clock input of the launch circuit; and
   a second flip-flop having a signal input, a clock input, and an output, wherein the signal input of the second flip-flop is coupled to the output of the first flip-flop, the clock input of the second flip-flop is coupled to the output of the multiplexer, and the output of the second flip-flop is coupled to the signal input of the launch flip-flop.

10. The timing measurement circuit of any one of clauses 1 to 9, wherein the capture circuit has a control input configured to receive an edge select signal, and wherein the capture circuit is configured to:
    select a rising edge of the clock signal for the second edge of the clock signal if the edge select signal has a first logic value; and
    select a falling edge of the clock signal for the second edge of the clock signal if the edge select signal has a second logic value.

11. The timing measurement circuit of clause 10, wherein the capture circuit comprises:
    a multiplexer having a first input, a second input, a select input, and an output, wherein the first input is coupled to the clock input of the capture circuit, and the select input is coupled to the control input of the capture circuit;

an inverter coupled between the clock input of the capture circuit and the second input of the multiplexer; and a clock gating circuit coupled between the output of the multiplexer and the output of the capture circuit.

12. The timing measurement circuit of any one of clauses 1 to 11, wherein the first edge of the clock signal is a rising edge and the second edge of the clock signal is a falling edge.

13. The timing measurement circuit of any one of clauses 1 to 11, wherein the first edge of the clock signal is a falling edge and the second edge of the clock signal is a rising edge.

14. A method of measuring a clock signal, comprising:
launching an edge of a timing signal on a first edge of the clock signal;
outputting an edge of a capture signal on a second edge of the clock signal;
receiving the edge of the timing signal and the edge of the capture signal at a time-to-digital converter (TDC); and
measuring a time delay using the TDC, wherein the time delay is between a time the edge of the timing signal is received at the TDC and a time the edge of the capture signal is received at the TDC.

15. The method of clause 14, wherein the first edge of the clock signal is a rising edge and the second edge of the clock signal is a falling edge, and the method further comprises:
determining a high phase of the clock signal based on the measured time delay.

16. The method of clause 15, further comprising:
propagating the edge of the timing signal through a delay circuit before the edge of the timing is received at the TDC;
wherein determining the high phase of the clock signal comprises determining the high phase of the clock signal based also on a time delay of the delay circuit.

17. The method of clause 14, wherein the first edge of the clock signal is a falling and the second edge of the clock signal is a rising edge, and the method further comprises:
determining a low phase of the clock signal based on the measured time delay.

18. The method of clause 17, further comprising:
propagating the edge of the timing signal through a delay circuit before the edge of the timing is received at the TDC;
wherein determining the low phase of the clock signal comprises determining the low phase of the clock signal based also on a time delay of the delay circuit.

It is to be appreciated that the present disclosure is not limited to the exemplary terminology used above to describe aspects of the present disclosure. For example, a clock generator may also be referred to as a clock source, a clock synthesizer, or another term. In another example, a delay buffer may also be referred to as a delay element, a delay unit, or another term. In another example, a timing measurement circuit may also be referred to as a duty-cycle measure circuit, a duty-cycle detector, or another term. A signal input of a flip-flop may also be referred to as a data input (e.g., D input) or another term. A signal path used for the clock signal may also be referred to as a clock path. Also, launching an edge of a signal may also be referred to as outputting the edge of the signal.

The duty-cycle control circuit 330 and the measurement control circuit 520 may each be implemented with a general-purpose processor, a digital signal processor (DSP), an application specific integrated circuit (ASIC), a field programmable gate array (FPGA) or other programmable logic device, discrete hardware components (e.g., logic gates), a state machine, or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A timing measurement circuit, comprising:
a launch circuit having an enable input, a clock input, and an output, wherein the launch circuit is configured to receive an enable signal at the enable input, receive a clock signal at the clock input of the launch circuit, and, in response to receiving the enable signal, launch an edge of a timing signal at the output of the launch circuit on a first edge of the clock signal;
a capture circuit having a clock input and an output, wherein the capture circuit is configured to receive the clock signal at the clock input of the capture circuit, and output an edge of a capture signal at the output of the capture circuit on a second edge of the clock signal; and
a time-to-digital converter (TDC) having a signal input, a capture input, and an output, wherein the signal input of the TDC is coupled to the output of the launch circuit, and the capture input of the TDC is coupled to the output of the capture circuit.

2. The timing measurement circuit of claim 1, wherein the TDC is configured to:
receive the edge of the timing signal at the signal input of the TDC;
receive the edge of the capture signal at the capture input of the TDC;
measure a time delay between a time that the edge of the timing signal is received and a time that the edge of the capture signal is received; and
output a signal indicating the measured time delay at the output of the TDC.

3. The timing measurement circuit of claim 1, further comprising a delay circuit having a signal input and an output, wherein the signal input of the delay circuit is coupled to the output of the launch circuit, and the output of the delay circuit is coupled to the signal input of the TDC.

4. The timing measurement circuit of claim 3, wherein the delay circuit has an adjustable time delay, and the delay circuit is configured to:

receive a delay control signal at a control input of the delay circuit; and set the time delay of the delay circuit based on the received delay control signal.

5. The timing measurement circuit of claim 4, wherein the TDC comprises:

a flip-flop having a signal input, a clock input, and an output, wherein the signal input of the flip-flop is coupled to the signal input of the TDC, the clock input of the flip-flop is coupled to the capture input of the TDC, and the output of the flip-flop is coupled to the output of the TDC.

6. The timing measurement circuit of claim 1, wherein the TDC comprises:

a delay line coupled to the signal input of the TDC, the delay line comprising delay buffers coupled in series; and flip-flops, each of the flip-flops having a respective signal input, a respective clock input, and a respective output, wherein the signal input of each of the flip-flops is coupled to an output of a respective one of the delay buffers, and the clock input of each of the flip-flops is coupled to the capture input of the TDC.

7. The timing measurement circuit of claim 1, wherein the launch circuit has a control input configured to receive an edge select signal, and wherein the launch circuit is configured to:

select a rising edge of the clock signal for the first edge of the clock signal if the edge select signal has a first logic value; and select a falling edge of the clock signal for the first edge of the clock signal if the edge select signal has a second logic value.

8. The timing measurement circuit of claim 7, wherein the launch circuit comprises:

a multiplexer having a first input, a second input, a select input, and an output, wherein the first input is coupled to the clock input of the launch circuit, and the select input is coupled to the control input of the launch circuit;

an inverter coupled between the clock input of the launch circuit and the second input of the multiplexer; and a launch flip-flop having a signal input, a clock input, and an output, wherein the signal input of the launch flip-flop is coupled to the enable input of the launch circuit, the clock input of the launch flip-flop is coupled to the output of the multiplexer, and the output of the launch flip-flop is coupled to the output of the launch circuit.

9. The timing measurement circuit of claim 8, wherein the launch circuit further comprises:

a first flip-flop having a signal input, a clock input, and an output, wherein the signal input of the first flip-flop is coupled to the enable input of the launch circuit, and the clock input of the first flip-flop is coupled to the clock input of the launch circuit; and a second flip-flop having a signal input, a clock input, and an output, wherein the signal input of the second flip-flop is coupled to the output of the first flip-flop, the clock input of the second flip-flop is coupled to the output of the multiplexer, and the output of the second flip-flop is coupled to the signal input of the launch flip-flop.

10. The timing measurement circuit of claim 1, wherein the capture circuit has a control input configured to receive an edge select signal, and wherein the capture circuit is configured to:

select a rising edge of the clock signal for the second edge of the clock signal if the edge select signal has a first logic value; and select a falling edge of the clock signal for the second edge of the clock signal if the edge select signal has a second logic value.

11. The timing measurement circuit of claim 10, wherein the capture circuit comprises:

a multiplexer having a first input, a second input, a select input, and an output, wherein the first input is coupled to the clock input of the capture circuit, and the select input is coupled to the control input of the capture circuit;

an inverter coupled between the clock input of the capture circuit and the second input of the multiplexer; and a clock gating circuit coupled between the output of the multiplexer and the output of the capture circuit.

12. The timing measurement circuit of claim 1, wherein the first edge of the clock signal is a rising edge and the second edge of the clock signal is a falling edge.

13. The timing measurement circuit of claim 1, wherein the first edge of the clock signal is a falling edge and the second edge of the clock signal is a rising edge.

14. A method of measuring a clock signal, comprising:

launching an edge of a timing signal on a first edge of the clock signal;

outputting an edge of a capture signal on a second edge of the clock signal;

receiving the edge of the timing signal and the edge of the capture signal at a time-to-digital converter (TDC); and measuring a time delay using the TDC, wherein the time delay is between a time the edge of the timing signal is received at the TDC and a time the edge of the capture signal is received at the TDC.

15. The method of claim 14, wherein the first edge of the clock signal is a rising edge and the second edge of the clock signal is a falling edge, and the method further comprises:

determining a high phase of the clock signal based on the measured time delay.

16. The method of claim 15, further comprising:

propagating the edge of the timing signal through a delay circuit before the edge of the timing is received at the TDC;

wherein determining the high phase of the clock signal comprises determining the high phase of the clock signal based also on a time delay of the delay circuit.

17. The method of claim 14, wherein the first edge of the clock signal is a falling and the second edge of the clock signal is a rising edge, and the method further comprises:

determining a low phase of the clock signal based on the measured time delay.

18. The method of claim 17, further comprising:

propagating the edge of the timing signal through a delay circuit before the edge of the timing is received at the TDC;

wherein determining the low phase of the clock signal comprises determining the low phase of the clock signal based also on a time delay of the delay circuit.

* * * * *